(12) United States Patent
Johnson et al.

(10) Patent No.: US 11,183,401 B2
(45) Date of Patent: Nov. 23, 2021

(54) SYSTEM AND RELATED TECHNIQUES FOR HANDLING ALIGNED SUBSTRATE PAIRS

(71) Applicant: SUSS MicroTec Lithography GmbH, Garching (DE)

(72) Inventors: Hale Johnson, Jericho, VT (US); Gregory George, Colchester, VT (US); Aaron Loomis, Huntington, VT (US)

(73) Assignee: SUSS MICROTEC LITHOGRAPHY GMBH, Garching (DE)

( * ) Notice: Subject to any disclaimer, the term of this patent is extended or adjusted under 35 U.S.C. 154(b) by 588 days.

(21) Appl. No.: 15/680,706

(22) Filed: Aug. 18, 2017

(65) Prior Publication Data

US 2017/0372925 A1 Dec. 28, 2017

Related U.S. Application Data

(63) Continuation-in-part of application No. 15/150,689, filed on May 10, 2016, now Pat. No. 10,825,705.
(Continued)

(51) Int. Cl.
*H01L 21/70* (2006.01)
*H01L 21/687* (2006.01)
(Continued)

(52) U.S. Cl.
CPC .... *H01L 21/67092* (2013.01); *H01L 21/6719* (2013.01); *H01L 21/67742* (2013.01);
(Continued)

(58) Field of Classification Search
CPC ......... H01L 21/68721; H01L 21/68707; H01L 24/80; H01L 21/68728; H01L 2224/75702;
(Continued)

(56) References Cited

U.S. PATENT DOCUMENTS

| | | | |
|---|---|---|---|
| 4,985,722 A | 1/1991 | Ushijima et al. | |
| 5,364,222 A | 11/1994 | Akimoto et al. | |

(Continued)

FOREIGN PATENT DOCUMENTS

| | | |
|---|---|---|
| CN | 101361177 A | 2/2009 |
| DE | 10230373 B3 | 3/2004 |

(Continued)

*Primary Examiner* — Mahdi H Nejad
(74) *Attorney, Agent, or Firm* — Hayes Soloway PC

(57) ABSTRACT

An industrial-scale system and method for handling precisely aligned and centered semiconductor substrate (e.g., wafer) pairs for substrate-to-substrate (e.g., wafer-to-wafer) aligning and bonding applications is provided. Some embodiments include an aligned substrate transport device having a frame member and a spacer assembly. The centered semiconductor substrate pairs may be positioned within a processing system using the aligned substrate transport device, optionally under robotic control. The centered semiconductor substrate pairs may be bonded together without the presence of the aligned substrate transport device in the bonding device. The bonding device may include a second spacer assembly which operates in concert with that of the aligned substrate transport device to perform a spacer hand-off between the substrates. A pin apparatus may be used to stake the substrates during the hand-off.

15 Claims, 11 Drawing Sheets

Related U.S. Application Data

(60) Provisional application No. 62/161,988, filed on May 15, 2015, provisional application No. 62/515,883, filed on Jun. 6, 2017.

(51) Int. Cl.
*H01L 21/67* (2006.01)
*H01L 21/677* (2006.01)
*H01L 23/00* (2006.01)
*H01L 21/683* (2006.01)

(52) U.S. Cl.
CPC .... *H01L 21/67748* (2013.01); *H01L 21/6838* (2013.01); *H01L 21/68707* (2013.01); *H01L 21/68721* (2013.01); *H01L 21/68728* (2013.01); *H01L 21/68742* (2013.01); *H01L 21/68771* (2013.01); *H01L 24/75* (2013.01); *H01L 24/80* (2013.01); *H01L 24/94* (2013.01); *H01L 24/08* (2013.01); *H01L 2224/08145* (2013.01); *H01L 2224/757* (2013.01); *H01L 2224/7531* (2013.01); *H01L 2224/7565* (2013.01); *H01L 2224/75101* (2013.01); *H01L 2224/75251* (2013.01); *H01L 2224/75252* (2013.01); *H01L 2224/75301* (2013.01); *H01L 2224/75305* (2013.01); *H01L 2224/75312* (2013.01); *H01L 2224/75701* (2013.01); *H01L 2224/75702* (2013.01); *H01L 2224/75703* (2013.01); *H01L 2224/75743* (2013.01); *H01L 2224/75754* (2013.01); *H01L 2224/80203* (2013.01); *H01L 2224/80907* (2013.01); *H01L 2224/94* (2013.01)

(58) Field of Classification Search
CPC ..... H01L 2224/757; H01L 2224/80907; H01L 2224/75301; H01L 21/678092; H01L 21/68771
See application file for complete search history.

(56) References Cited

U.S. PATENT DOCUMENTS

| | | | |
|---|---|---|---|
| 5,975,834 A | 11/1999 | Ogawa et al. | |
| 7,948,034 B2 | 5/2011 | George et al. | |
| 8,139,219 B2 | 3/2012 | George | |
| 8,985,929 B2 | 3/2015 | Enokida et al. | |
| 9,061,423 B2 | 6/2015 | Pergande | |
| 9,508,541 B2 | 11/2016 | Lee et al. | |
| 9,589,822 B2 | 3/2017 | Shindo | |
| 2006/0120832 A1 | 6/2006 | Chhibber et al. | |
| 2007/0128008 A1 | 6/2007 | Morikawa | |
| 2010/0071847 A1* | 3/2010 | Shin | H01L 21/67092 156/285 |
| 2011/0014774 A1 | 1/2011 | Johnson et al. | |
| 2011/0236011 A1 | 9/2011 | Kaneyama | |
| 2012/0128457 A1 | 5/2012 | Chang et al. | |
| 2012/0224945 A1 | 9/2012 | Douki et al. | |
| 2013/0078059 A1 | 3/2013 | Enokida et al. | |
| 2013/0078061 A1 | 3/2013 | Enokida et al. | |
| 2014/0023776 A1 | 1/2014 | Kuwahara et al. | |
| 2014/0295656 A1 | 8/2014 | Waterworth et al. | |
| 2015/0076849 A1 | 3/2015 | Jin et al. | |
| 2015/0086316 A1 | 3/2015 | Greenberg et al. | |
| 2015/0206783 A1 | 7/2015 | Johnson et al. | |
| 2016/0111318 A1 | 4/2016 | Ichinose | |
| 2016/0118362 A1 | 4/2016 | Han et al. | |
| 2016/0126128 A1 | 5/2016 | Bonora et al. | |
| 2016/0158939 A1 | 6/2016 | Nakada et al. | |
| 2016/0225625 A1 | 8/2016 | Wimplinger et al. | |
| 2016/0243590 A1 | 8/2016 | Crest et al. | |
| 2016/0284571 A1* | 9/2016 | Kurashina | H01L 21/67057 |
| 2016/0336208 A1 | 11/2016 | Johnson et al. | |
| 2016/0336212 A1* | 11/2016 | Johnson | H01L 24/80 |
| 2016/0351428 A1* | 12/2016 | Feng | H01L 21/68707 |
| 2017/0062264 A1* | 3/2017 | Tang | H01L 21/68707 |
| 2017/0372933 A1 | 12/2017 | Kim | |

FOREIGN PATENT DOCUMENTS

| | | |
|---|---|---|
| JP | H09205127 A | 8/1997 |
| JP | 2004207436 A | 7/2004 |
| JP | 2013162029 A | 8/2013 |
| KR | 20020032044 A | 5/2002 |
| KR | 20110033456 A | 3/2011 |
| KR | 20160064789 A | 6/2016 |
| WO | 0218107 A1 | 3/2002 |
| WO | 2012113799 A1 | 8/2012 |

\* cited by examiner

SYSTEM AND RELATED TECHNIQUES FOR HANDLING ALIGNED SUBSTRATE PAIRS

CROSS-REFERENCE TO RELATED APPLICATIONS

This patent application is a Continuation-in-Part of U.S. Non-Provisional patent application Ser. No. 15/150,689, filed on May 10, 2016, and titled "Apparatus, System, and Method for Handling Aligned Wafer Pairs," which claims the benefit of U.S. Provisional Patent Application No. 62/161,988, filed May 15, 2015, and titled "Apparatus and Method for Handling Aligned Wafer Pairs." This patent application also claims the benefit of U.S. Provisional Patent Application No. 62/515,883, filed Jun. 6, 2017, and titled "System and Related Techniques for Handling Aligned Wafer Pairs." This patent application is also related to U.S. Non-Provisional patent application Ser. No. 15/150,856, filed May 10, 2016, issued as U.S. Pat. No. 9,640,418 on May 2, 2017, and titled "Apparatus, System, and Method for Handling Aligned Wafer Pairs," which is a divisional of the aforementioned U.S. Non-Provisional patent application Ser. No. 15/150,689. The disclosures of these patent applications and issued patent are herein incorporated by reference in their entirety.

FIELD OF THE DISCLOSURE

The present disclosure relates to system components and a method for handling aligned substrate pairs and, more particularly, to components configured to maintain alignment of aligned semiconductor substrate pairs with a precision suitable for substrate-to-substrate (e.g., wafer-to-wafer) bonding applications.

BACKGROUND

Wafer-to-wafer (W2W) bonding is deployed in a wide range of semiconductor process applications for forming semiconductor devices. Examples of semiconductor process applications where wafer-to-wafer bonding is applied include substrate engineering and fabrication of integrated circuits, packaging and encapsulation of micro-electro-mechanical-systems (MEMS), and stacking of many processed layers (3D-integration) of pure microelectronics. W2W bonding involves aligning the surfaces of two or more wafers, transporting the aligned wafers into a wafer bonding chamber, bringing the wafer surfaces in contact, and forming a strong bond interface between them. The overall process yield and manufacturing cost of the so-produced semiconductor devices, and ultimately the cost of the electronic products that incorporate these devices, depend greatly upon the quality of the W2W bond. The quality of the W2W bond depends upon the accuracy of the wafer alignment, the preservation of the wafer alignment during the transport and the bonding process, and the uniformity and integrity of the bond strength across the wafer bond interfaces. Furthermore, extreme care is needed during the transport, positioning, centering, and alignment of the wafers in order to avoid fracture, surface damage, or warping of the wafers.

FIG. 1A depicts a schematic diagram of a conventional transport fixture used to transport aligned wafers from an aligner to a bonder, in accordance with the prior art. Traditionally, a wafer pair 18 is aligned in an aligner station 50, and aligned wafer pair 18 is secured onto a transport fixture 24, as shown in FIG. 1A. Transport fixture 24 carries aligned wafer pair 18 to bonding station 60 and to any further processing stations. A prior art transport fixture 24 is described in U.S. Pat. No. 7,948,034, issued on May 24, 2011, and titled "Apparatus and Method for Semiconductor Bonding," the contents of which are incorporated by reference herein.

FIG. 2A depicts the conventional transport fixture of FIG. 1A and as discussed relative to FIG. 3, in accordance with the prior art. FIG. 2B depicts an enlarged view of the clamping assemblies of the conventional transport fixture of FIG. 2A, in accordance with the prior art. FIG. 3 is a schematic depiction of loading an aligned wafer pair into a bonding chamber using a conventional transport fixture, in accordance with the prior art. Referring first to FIG. 3, a conventional transport fixture 24 is sized to hold an aligned wafer pair (not shown), and a transport device 16 is used to move transport fixture 24 and the aligned wafer pair into and out of bonding chamber 12. In one example, transport device 16 is a transport arm or slide that is automated or otherwise manually operated.

As shown in FIG. 2A, transport fixture 24 is a circular shaped ring 280, often constructed from titanium, and includes three noses 280a, 280b, 280c that are symmetrically spaced about circular shaped ring 280 that act as support points for a base wafer. Proximate to each of the three noses 280a, 280b, 280c are three spacer and clamp assemblies 282a, 282b, 282c arranged symmetrically at the periphery of the circular ring 280 at 120° apart. Each spacer and clamp assembly 282a, 282b, 282c includes a spacer 284 and a clamp 286. Spacer 284 is configured to set two wafers at a predetermined distance. Spacers 284 with different thicknesses may be selected for setting different spacings between the two wafers. Once the spacers 284 are inserted between the wafers, clamp 286 is clamped down to lock the position of the two wafers. Clamp 286 may be a single structure or a linkage that moves downward to contact an upper wafer to retain it in position on transport fixture 24. Each spacer 284 and each clamp 286 are independently activated by linear actuators 283 and 285, respectively.

For the bonding process, two aligned wafers are placed in carrier fixture 24 and are spaced apart with spacers 284 and then clamped down with clamps 286. The fixture with the clamped wafers is inserted in bonding chamber 12, and then each clamp 286 is unclamped one at a time, and spacers 284 are removed. Once all spacers 284 are removed, the two wafers are staked together with a pneumatically controlled center pin. Then, a force column is applied to facilitate the bonding process in bonding device 12 throughout the high-temperature bonding process.

Within the industry, it is known that transport fixtures 24 can be heavy and challenging for transport device 16 or a robot to handle. Further, once they are positioned within bonding device 12, transport fixtures 24 remain in bonding device 12 throughout the duration of the bonding process, thus subjecting transport fixtures 24 to bonding environments of up to 550° C. temperatures, as well as chamber gasses and/or pressures that may be used within bonding device 12. In particular, transport fixture 24 may be positioned for an hour or more in a location only a few millimeters away from an outer circumference of a heated chuck of bonding device 12, such that transport fixture 24 gets very hot. These conditions place a significant amount of stress on transport fixtures 24, and especially on the intricate mechanics of spacers 284 and clamps 286. As a result, over time, transport fixtures 24 become unreliable and require significant servicing, including sensitive adjustment of the mechanics, which has high costs and takes substantial time.

In other implementations, the aligned wafer pair is bonded temporarily, and the temporarily bonded wafer pair is transported into the bonding station and any other processing stations. Temporary bonding of the wafers may be used to minimize alignment shift error during processing. The temporary wafer bonding techniques include bonding the centers or the edges of the wafers with a laser beam, a temporary tack adhesive, and hybrid fusion. The bonded wafer pair is then transported to the bonding device with a transport fixture or similar, conventional transportation devices. The laser bonding techniques require at least one laser-transparent wafer, and the adhesive bonding techniques may contribute to contamination of the wafer surfaces.

Accordingly, in light of the aforementioned deficiencies and inadequacies, it is desirable to provide an industrial-scale system and method for handling precisely aligned and centered semiconductor substrate (e.g., wafer) pairs for substrate-to-substrate (e.g., wafer-to-wafer) bonding applications with high throughput and the ability to handle all types of substrates without introducing any contaminants.

SUMMARY

One example embodiment provides a substrate processing system configured to bond a pair of substrates. The system includes a processing chamber. The system further includes a spacer assembly disposed within the processing chamber and including a spacer configured to be: inserted between the pair of substrates; and incident with a guide feature of an aligned substrate transport device disposed within the processing chamber, wherein the spacer is configured to stop advancing within the processing chamber upon incidence with the guide feature before being inserted between the pair of substrates. In some cases, the spacer assembly further includes a biasing element configured to provide for radial pre-loading, in that it provides a pre-loaded starting point for outward radial thermal expansion compliance for the pair of substrates. In some such cases, the spacer assembly further includes: a driver; a shaft operatively coupled with the driver; and a bearing operatively coupled with the shaft and the spacer. Additionally, the driver is configured to provide linear movement of the shaft in a manner providing linear movement of the bearing and the spacer. In some such cases, the system further includes a mounting portion operatively coupling the shaft and the bearing such that movement of the mounting portion via the shaft provides movement of the bearing, wherein: the bearing is mounted to the mounting portion; the mounting portion and the shaft have a degree of clearance providing a floating coupling therebetween; and the pre-loaded starting point is provided at the floating coupling. In some such cases, the biasing element includes a spring element having: a first end coupled with the mounting portion; and a second end interfaced with a portion of the shaft extending beyond the mounting portion. In some instances, the spacer assembly is configured to provide the spacer with a pre-load force to reduce opportunity for deflection of the spacer when the spacer is being inserted between the pair of substrates.

Another example embodiment provides an apparatus configured to handle a pair of substrates. The apparatus includes a frame member. The apparatus further includes a spacer assembly coupled with the frame member and including: a first spacer configured to be inserted between the pair of substrates; and a guide feature configured to provide a reference stopping point for advancement of a second spacer of a substrate processing apparatus. In some cases, the guide feature is substantially L-shaped, having: a first leg affixed to the first spacer and aligned substantially perpendicular with a length of the first spacer; and a second leg aligned substantially parallel with the length of the first spacer. In some other cases, the guide feature and the first spacer are of monolithic construction. Additionally, the guide feature is substantially L-shaped, having: a first leg extending from the first spacer and aligned substantially perpendicular with a length of the first spacer; and a second leg aligned substantially parallel with the length of the first spacer. In some instances, being configured to provide the reference stopping point for the second spacer, the guide feature is configured to physically contact the second spacer and stop advancement of the second spacer in a vertical direction. In some cases, the apparatus further includes a biasing element configured to provide for radial pre-loading, in that it provides a pre-loaded starting point for outward radial thermal expansion compliance for the pair of substrates. In some such cases, the spacer assembly further includes: a driver; a shaft operatively coupled with the driver; and a bearing operatively coupled with the shaft and the first spacer. Additionally, the driver is configured to provide linear movement of the shaft in a manner providing linear movement of the bearing and the first spacer. In some such cases, the apparatus further includes an arm portion operatively coupling the shaft and the bearing such that movement of the arm portion via the shaft provides movement of the bearing, wherein: the arm portion and the shaft have a degree of clearance providing a floating coupling therebetween; and the pre-loaded starting point is provided at the floating coupling. In some such cases, the biasing element includes a spring element having: a first end coupled with the bearing; and a second end interfaced with a portion of the shaft extending beyond the arm portion.

Another example embodiment provides a pin apparatus configured to apply a compression force to a pair of substrates in spaced alignment within a substrate processing chamber. The pin apparatus includes a pin tip. The pin apparatus further includes a foot portion including: a point contact feature disposed at a first end of the foot portion and configured to be incident with the pin tip; and a substantially planar base disposed at a second end of the foot portion, opposite the first end, and configured to be incident with one of the pair of substrates. In some cases, the point contact feature is of hemispherical shape, extending from the first end of the foot portion toward the pin tip. In some instances, the foot portion is movable relative to the pin tip such that: in an uncompressed state of the foot portion, a gap exists between the foot portion and the pin tip; and in a compressed state of the foot portion, the point contact feature is incident with the pin tip. In some cases, the pin apparatus is configured to be radially compliant such that it is pre-loaded to center with top center locating. In some instances, the foot portion is configured to be incident with a center of the one of the pair of substrates. In some cases, the pin apparatus further includes an O-ring configured to: permit radial movement of the pin tip and foot portion; and provide a pre-load to center force. In some instances, the pin apparatus further includes a bearing configured to: permit radial movement of the pin tip and foot portion; and provide for gimbaling behavior by the pin apparatus. In some cases, the pin apparatus is configured to apply the compression force to the pair of substrates in a manner that at least one of: matches pressure applied to the pair of substrates by one or more surrounding chucks; and is distributed uniformly with respect to the pair of substrates.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1A:
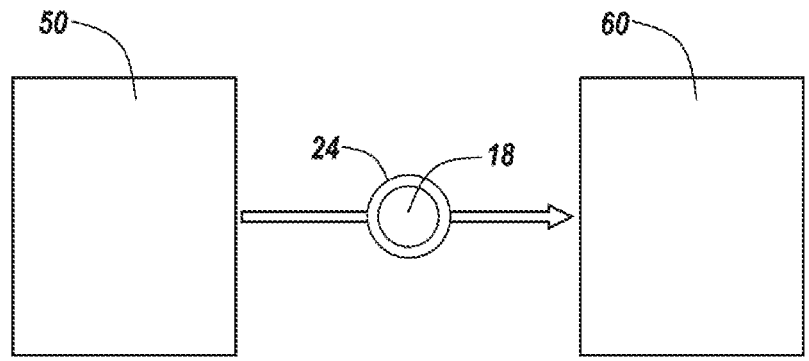
FIG. 1A depicts a schematic diagram of a conventional transport fixture used to transport aligned substrates from an aligner to a bonder, in accordance with the prior art.

The present disclosure provides an industrial-scale system and method for handling precisely aligned and centered semiconductor substrate (e.g., wafer) pairs for substrate-to-substrate (e.g., wafer-to-wafer) aligning and bonding applications with high throughput. The system may include an aligned substrate transport device (e.g., such as an end effector), which optionally may be attached at the end of a robotic arm. The transport device may be configured to hold, move, and place an aligned pair of substrates into and out of various processing stations without changing the substrate-to-substrate alignment and without introducing any contaminants. The system also may include a bonding device including a second spacer assembly which operates in concert with that of the aligned substrate transport device to perform a spacer hand-off between the substrates. The system also may include a pin apparatus configured to stake the substrates during the hand-off.

It should be noted that, throughout this disclosure, reference may be made to one or more substrates, such as substrates 20, 30. As will be appreciated in light of this disclosure, a given substrate may be a semiconductor wafer or other wafer, but is not intended to be limited only thereto. A given substrate may be substantially planar, though planarity is not required. A given substrate may be of generally circular or polygonal (e.g., rectangular, square, or other quadrilateral) shape, having a diameter/width of any desired size (e.g., about 2, 3, 4, 5, 6, 8, 12, or 18 inches or greater). A given substrate may have a thickness (e.g., an average thickness) in the range of about 50-3,000 μm or greater. A given plurality of substrates may be of substantially the same size in one or more dimensions (e.g., substantially the same circumference) or of differing sizes, as desired. For a given plurality of substrates, one substrate may be disposed over another, in some instances serving as a lid or cover for the underlying substrate. In some cases, a given substrate may have either (or both) a substantially straight (flat) edge and a notch at its perimeter.

Regarding material composition, a given substrate may be formed from any one, or combination, of: (1) a semiconductor material, such as silicon (Si) or gallium arsenide (GaAs); (2) a glass, such as quartz glass; (3) a plastic; or (4) a ceramic. Other suitable substrate materials will be apparent in light of this disclosure and will depend on a given target application or end-use. Moreover, a given substrate may be monocrystalline, polycrystalline, or amorphous, in part or in whole, as desired. In some cases, a given substrate may include one or more structures, which may be regularly aligned or provided in other desired arrangement on or in at least one of its surfaces. In some instances, the structures may include ridges, cavities, or the like. In some instances, the structures may include electrical circuits, such as transistors, light-emitting diodes (LEDs), photodetectors, integrated circuits (ICs), or optical elements, to name a few. In some instances, the structures may include or be constituents of micro-electro-mechanical systems (MEMS) or micro-opto-electro-mechanical systems (MOEMS). A given substrate may include one or more layers, coatings, bond adhesives, adhesive beads, separating layers, residues, and/or impurities on at least one of its surfaces. The structures, coatings, residues, and the like may be arranged on a surface of a first substrate that faces a second substrate.

Figure 1B:
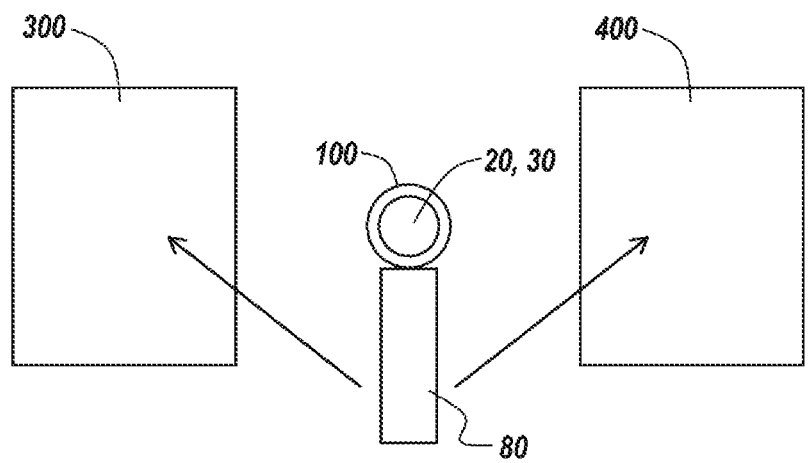
FIG. 1B depicts a schematic diagram of an aligned substrate transport device and method used to transport aligned substrates from an aligner to a bonding device, in accordance with a first exemplary embodiment of this disclosure.

FIG. 1B depicts a schematic diagram of an aligned substrate transport device and method used to transport aligned substrates 20, 30 from an aligner to a bonding device, in accordance with a first exemplary embodiment of this disclosure. As shown in FIG. 1B, an aligned substrate transport device 100 is attached to a robotic arm 80 and is configured to move into and out of an alignment device 300 and a separate bonding station 400 having a bonding device. A pair of two substrates 20, 30 is carried by transport device 100 into alignment device 300 where two substrates 20, 30 are aligned relative to each other, and their alignment is secured with the transport device 100. Next, robotic arm 80 moves transport device 100 with aligned substrate pair 20, 30 out of alignment device 300 and into bonding station 400, where the two aligned substrates 20, 30 can be bonded. Transport device 100 is capable of placing the two aligned substrates 20, 30 in the bonding device, and then robotic arm 80 removes it from the bonding device for the duration of the bonding process. Once the bonding process is complete, robotic arm 80 moves transport device 100 back into the bonding device to collect the bonded substrate pair 20, 30, which is supported by transport device 100 as it is removed from bonding station 400. In some embodiments, alignment device 300 and bonding station 400 are integrated into the same reactor.

Figure 4A:
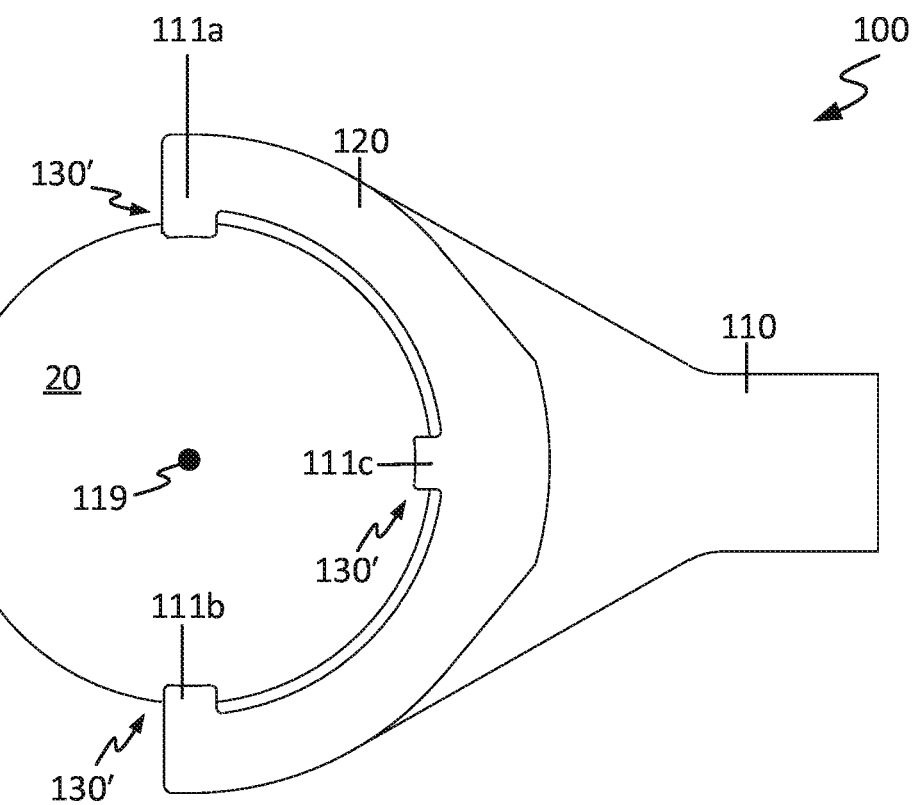
FIGS. 4A-4B illustrate top-down and bottom-up plan views, respectively, of an aligned substrate transport device including a plurality of spacer assemblies configured in accordance with an embodiment of the present disclosure.
Figure 4B:
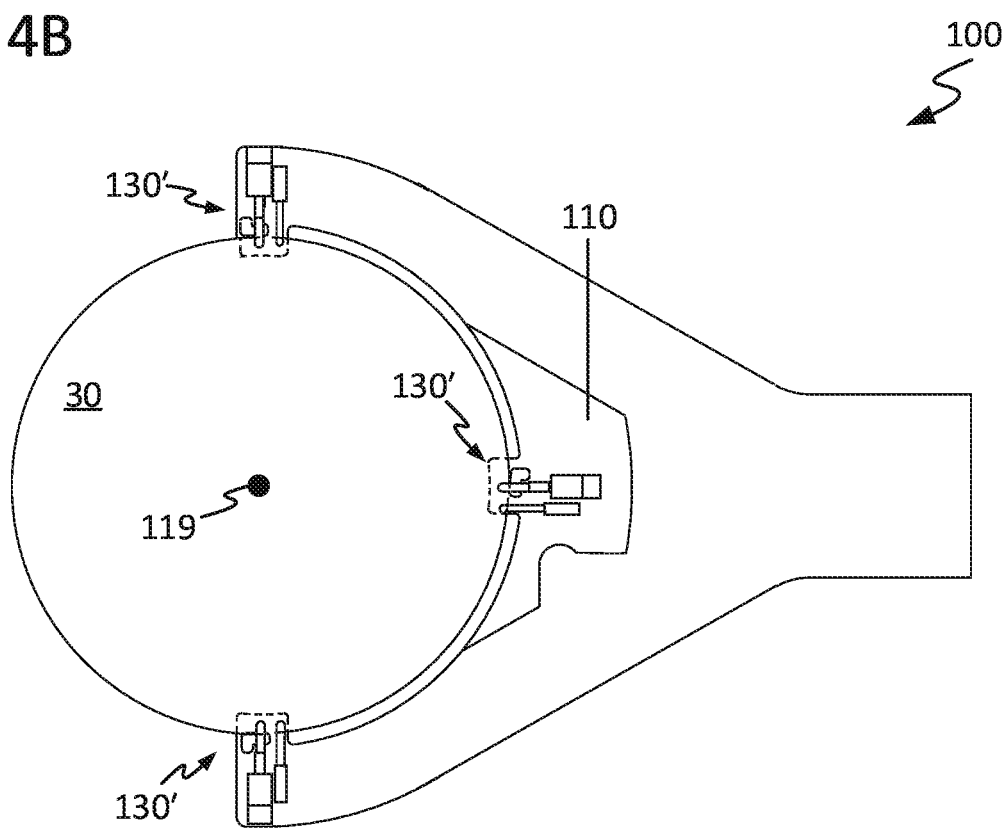

FIGS. 4A-4B illustrate top-down and bottom-up plan views, respectively, of an aligned substrate transport device 100 including a plurality of spacer assemblies 130' configured in accordance with an embodiment of the present disclosure. Transport device 100 may be used to transport aligned substrates (e.g., wafers) into and out of processing chambers, in accordance with some embodiments. Transport device 100 may be, for example, an end effector or other wafer or substrate transport fixture. Numerous configurations and variations will be apparent in light of this disclosure.

Transport device 100 may include a Y-shaped fixed frame 110 and a floating carrier 120 disposed on top of frame 110. In one example, frame 110 has a semi-circular inner perimeter 110a with a radius that approximately matches the radius of substrates 20, 30. In other examples, frame 110 has a Y-shaped or fork-shaped inner perimeter. Similarly, carrier 120 has a semi-circular inner perimeter 120a with a radius that approximately matches the radius of substrates 20, 30. In accordance with some embodiments, the semi-circular inner perimeter 120a of floating carrier 120 may be understood as a partial ring structure which has ends that terminate before a complete ring (e.g., 3600) is formed. As shown in FIGS. 4A-4B, the structure of the semi-circular inner perimeter 120a may be formed from a floating carrier 120 with a partial ring shape that includes substantially 1800 of rotation, or in other designs the partial ring shape may be up to 270°. Other partial ring configurations of floating carrier 120 are also considered within the scope of the present disclosure.

Figure 2A:
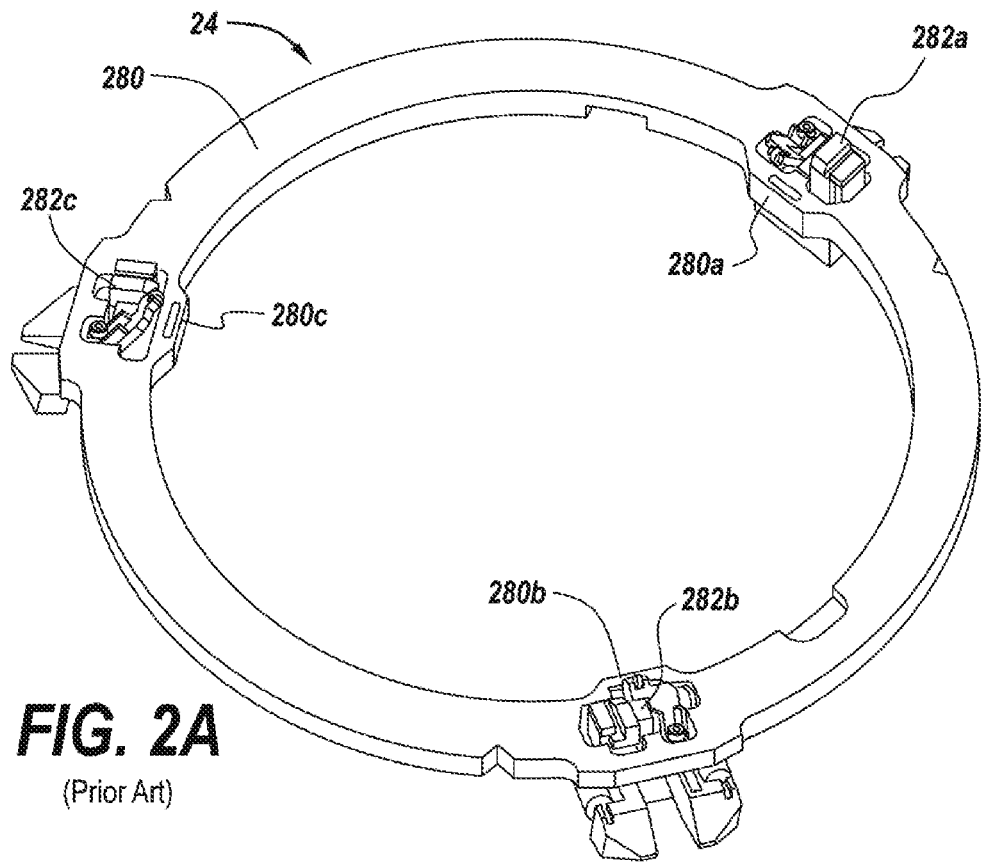
FIG. 2A depicts the conventional transport fixture of FIG. 1A and as shown in FIG. 3, in accordance with the prior art.
Figure 2B:
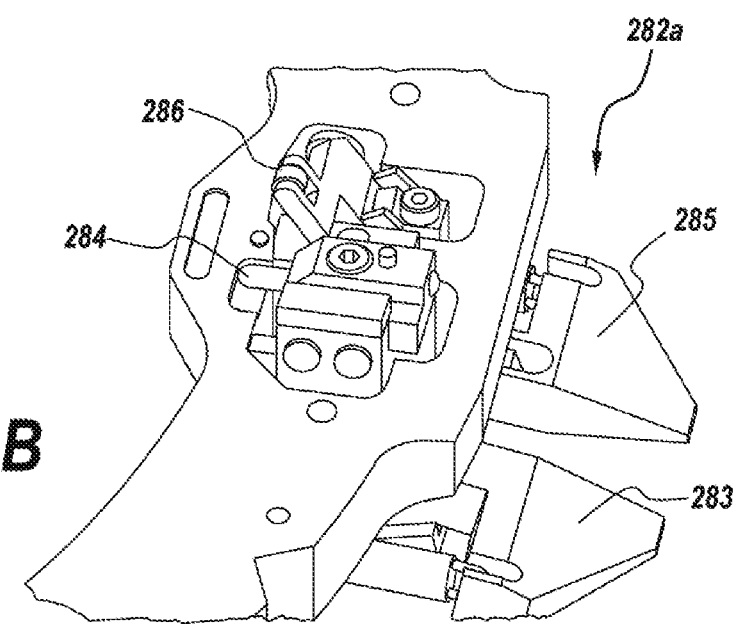
FIG. 2B depicts an enlarged view of the clamping assemblies of the conventional transport fixture of FIG. 2A, in accordance with the prior art.
Figure 3:
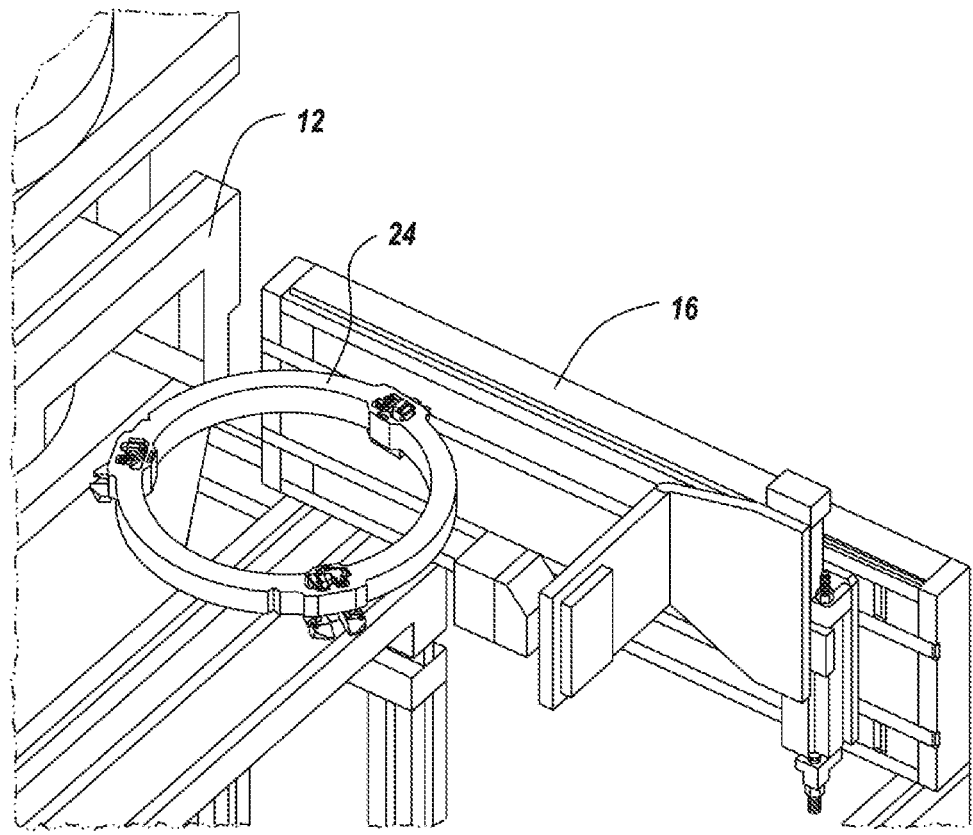
FIG. 3 is a schematic depiction of loading an aligned substrate pair into a bonding chamber using a conventional transport fixture, in accordance with the prior art.

Floating carrier 120 may be formed from a substantially planar structure that is oriented in parallel to a plane of frame 110 and positioned spaced therefrom. Transport device 100 may be understood to have floating carrier 120 positioned on a top side thereof, whereas frame member 110 may be positioned on a bottom side thereof. Unlike a conventional transport apparatus, which carries both substrates of the aligned substrate pair on a top surface thereof (e.g., as discussed relative to FIGS. 2A-2C), transport device 100 may carry substrates 20, 30 interior of the arms of frame member 110 and in a position below the extended lip of floating carrier 120. This design allows the edges of substrates 20, 30 to be held between fixed frame 110 and floating carrier 120 in various locations about the inner perimeters of frame member 110 and floating carrier 120, such as in three locations 111a, 111b, 111c.

Transport device 100 further may include a number of assemblies to hold and/or space substrates 20, 30, such as spacer assemblies 130' disposed about the inner perimeter of frame member 110. As can be seen, transport device 100 may include a first spacer assembly 130' at a first location 111a, a second spacer assembly 130' at a second location 111b, and a third spacer assembly 130' at a third location 111c. Of course, as will be appreciated in light of this disclosure, a lesser quantity (e.g., two or fewer) or greater quantity (e.g., four or more) of spacer assemblies 130' may be provided, in accordance with other embodiments, as desired for a given target application or end-use.

Figure 5:
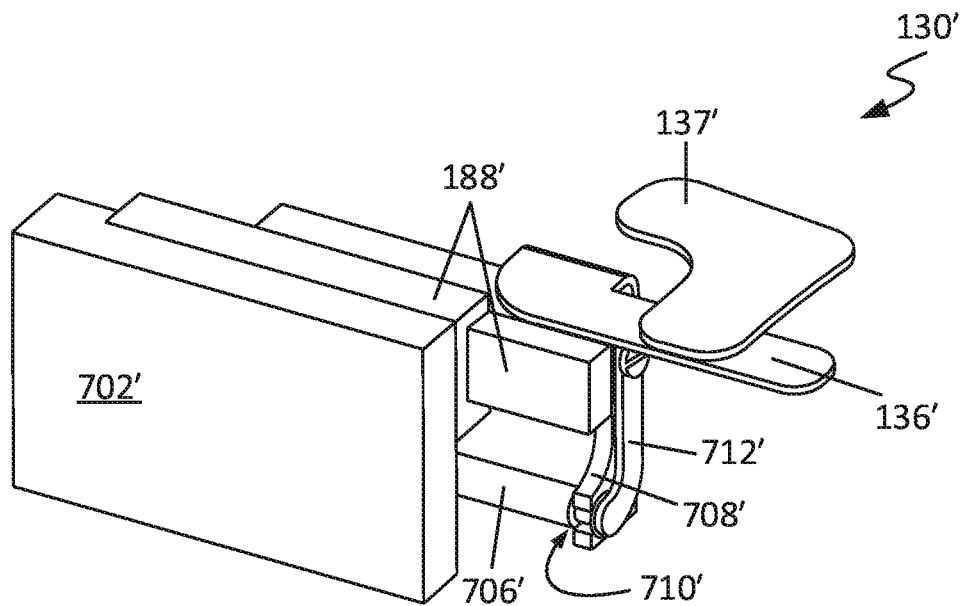
FIG. 5 illustrates an isometric side view of an aligned substrate transport device spacer assembly configured in accordance with an embodiment of the present disclosure.
Figure 6:
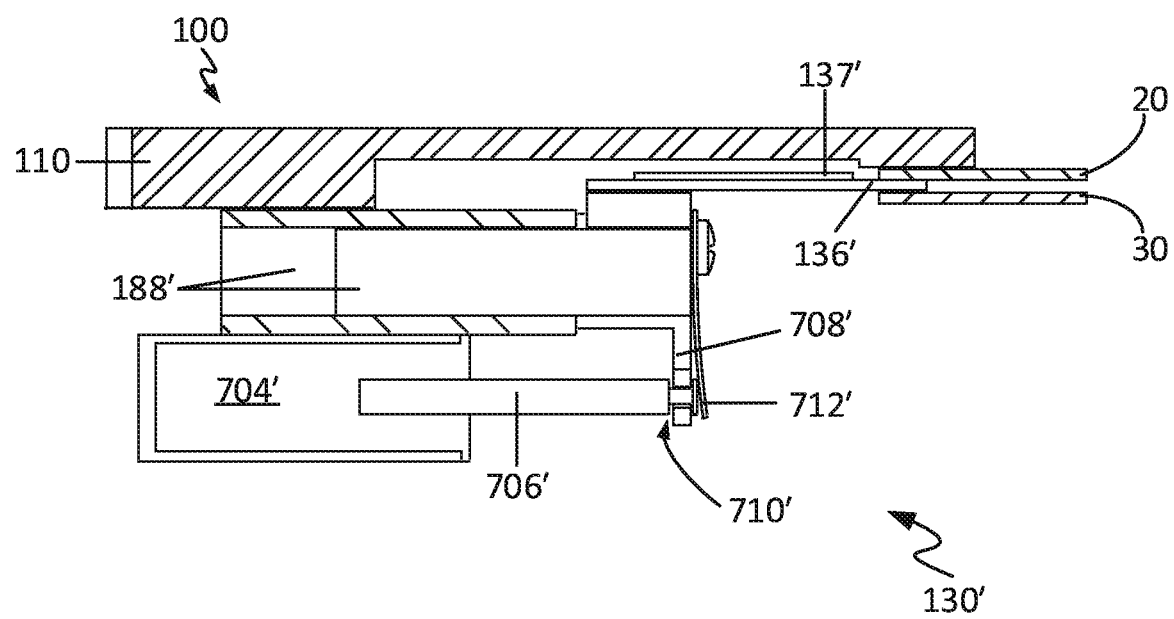
FIG. 6 illustrates a cross-sectional side elevation view of an aligned substrate transport device spacer assembly configured in accordance with an embodiment of the present disclosure.

FIG. 5 illustrates an isometric side view of a spacer assembly 130' configured in accordance with an embodiment of the present disclosure. FIG. 6 illustrates a cross-sectional side elevation view of a spacer assembly 130' configured in accordance with an embodiment of the present disclosure. As can be seen from FIGS. 5-6, spacer assembly 130' may include a mounting portion 702', which may be coupled, directly or indirectly, with transport device 100 (e.g., at a given location 111a, 111b, or 111c thereof). To that end, mounting portion 702' may be coupled via any suitable fastening means, as will be apparent in light of this disclosure. The dimensions and specific configuration of mounting portion 702' may be customized, as desired for a given target application or end-use. Numerous suitable configurations for mounting portion 702' will be apparent in light of this disclosure.

Spacer assembly 130' also may include a driver 704', which may be coupled, directly or indirectly, with mounting portion 702'. Driver 704' may be configured to provide for linear movement (e.g., extension and retraction) of an element coupled thereto. To that end, driver 704' may be, in some embodiments, a piston-type pneumatic drive configured as typically done. The present disclosure is not intended to be so limited, however, as in some other embodiments, driver 704' may be a mechanical, electronic, or other suitable drive element, as will be apparent in light of this disclosure. The stroke length of driver 704' may be customized, as desired for a given target application or end-use. In at least some embodiments, driver 704' may have a hard-stop stroke length. Other suitable configurations for driver 704' will depend on a given application and will be apparent in light of this disclosure.

Spacer assembly 130' further may include a shaft 706', which may be coupled, directly or indirectly, with driver 704'. The dimensions and specific configuration of shaft 706' may be customized, as desired for a given target application or end-use. In at least some embodiments, shaft 706' may be generally cylindrical in shape. In accordance with some embodiments, a first end (e.g., a proximal end) of shaft 706' may be operatively coupled with driver 704'. In accordance with some embodiments, a second end (e.g., a distal end) of shaft 706' may be operatively coupled with a coupling arm 708' (discussed below) and may interface with a biasing element 712' (discussed below). In this manner, driver 704' may drive shaft 706' in a linear fashion, and shaft 706' may apply force to coupling arm 708' and biasing element 712' in operation of spacer assembly 130'. Other suitable configurations for shaft 706' will depend on a given application and will be apparent in light of this disclosure.

As previously noted, spacer assembly 130' may include a coupling arm 708' coupled, directly or indirectly, with shaft 706'. Coupling arm 708' may be configured as a generally elongate body having a forked end configured to interface with the second end (e.g., distal end) of shaft 706'. At that interface, coupling arm 708' may receive the second end of shaft 706' with a given degree of clearance (e.g., a gap), optionally providing a floating coupling 710'. The end of coupling arm 708' located opposite its forked end may be coupled, directly or indirectly, with bearing 188' (discussed below) via one or more suitable fasteners. Other suitable configurations for coupling arm 708' will depend on a given application and will be apparent in light of this disclosure.

As previously noted, spacer assembly 130' also optionally may include a biasing element 712'. In accordance with some embodiments, biasing element 712' may be configured as a generally elongate body having a first end configured to interface with the second end (e.g., distal end) of shaft 706' protruding beyond the forked end of coupling arm 708'. A second end of biasing element 712' may be coupled, directly or indirectly, with bearing 188' (discussed below) via one or more suitable fasteners. In accordance with some embodiments, biasing element 712' may be configured to provide for radial pre-loading, providing a pre-loaded starting point at floating coupling 710' for outward radial thermal expansion compliance for substrates 20, 30. In this manner, biasing element 712', and thus spacer assembly 130' more generally, may allow for spacer 136' (discussed below) to move as substrates 20, 30 radially grow or shrink in size because of temperature changes in bonder chamber 410. To such ends, biasing element 712' may be, for example, a low-force leaf spring or other suitable spring element configured to provide a given degree of pre-loading. In some cases, biasing element 712' may be configured to provide a restoring force in the range of about 0.5-2.0 N, though greater or lesser forces may be provided, as desired for a given target application or end-use. Other suitable configurations for biasing element 712' will depend on a given application and will be apparent in light of this disclosure.

It should be noted, however, that the present disclosure is not intended to be limited to provision of pre-loading and radial compliance only by embodiments involving an optional biasing element 712' and an optional floating coupling 710'. For instance, in accordance with some other embodiments, either (or both) of biasing element 712' and floating coupling 710' may be omitted, and in some such cases, the force exerted by driver 702' may be reduced to a given desired degree to provide for the same or substantially similar pre-loading and compliance capabilities as those discussed above with respect to cases involving biasing element 712' and/or floating coupling 710'. Numerous configurations and variations will be apparent in light of this disclosure.

Furthermore, as previously noted, spacer assembly 130' may include a bearing 188', which may be coupled, directly or indirectly, with mounting portion 702'. In accordance with some embodiments, bearing 188' may be configured to facilitate linear movement (e.g., extension and retraction) of an element coupled therewith. To that end, bearing 188' may be, for example, a linear-motion bearing including sliding rail components configured as typically done. By virtue of the coupling of driver 704' with shaft 706', coupling arm 708', and thus bearing 188', bearing 188' may be able to advance or retreat as driver 704' advances or retreats shaft 706'. Thus, bearing 188' may have a stroke length substantially the same as the stroke length of driver 704', as discussed above. Also, by virtue of the coupling of biasing element 712' with bearing 188', bearing 188' may experience the restoring force, in part or in whole, provided by biasing element 712'. Other suitable configurations for bearing 188' will depend on a given application and will be apparent in light of this disclosure.

As can be seen further from FIGS. 5-6, spacer assembly 130' may include a spacer 136', which may be coupled, directly or indirectly, with bearing 188'. Spacer 136' may be a spacer flag or other suitable spacer body configured to be inserted, in a temporary or otherwise desired manner, between substrates 20, 30. As will be appreciated in light of this disclosure, spacer 136' may be configured to operate in much the same manner and to serve much the same purpose, for example, as spacers 136a, 136b, 136c discussed in U.S. patent application Ser. No. 15/150,689 (hereinafter, the '689 application), in accordance with some embodiments. To such ends, the shape and dimensions of spacer 136' may be customized, as desired for a given target application or end-use. By virtue of the coupling of driver 704' with shaft 706', coupling arm 708', and bearing 188', spacer 136' may be able to advance or retreat as driver 704' advances or retreats shaft 706'. Thus, spacer 136' may have a stroke length substantially the same as the stroke length of driver 704', as discussed above. Also, by virtue of the coupling of biasing element 712' with bearing 188', spacer 136' may experience the restoring force, in part or in whole, provided by biasing element 712'. As previously discussed, this may provide for a given degree of radial compliance, as desired for a given target application or end-use. In accordance with some embodiments, spacer 136' optionally may be configured to provide a given degree of z-compliance, which, at least in some instances, may facilitate provision of good clamping action in relation to substrates 20, 30.

Spacer(s) 136' may be used to space substrates 20, 30 from one another when they are received by transport device 100. In one example, spacers 136' may be constructed from a stainless-steel body with a titanium nitride (TiN) coating, but various other materials and coatings also may be used. Spacer(s) 136' may be inserted underneath the edge of substrate 20 in any (or all) corresponding three locations 111a, 111b, 111c, and then substrate 30 may be stacked underneath spacer(s) 136', as generally shown. A given spacer 136' may be configured to move substantially horizontally. Other suitable configurations for spacer 136' will depend on a given application and will be apparent in light of this disclosure.

Also, as can be seen from FIGS. 5-6, spacer assembly 130' may include a guide feature 137'. In some embodiments, guide feature 137' and spacer 136' may be of monolithic construction (e.g., formed together as a singular, unitary piece). In some other embodiments, guide feature 137' and spacer 136' may be separate pieces (e.g., may be of polylithic construction), which may be affixed or otherwise operatively coupled, directly or indirectly, with one another. The shape and dimensions of guide feature 137' may be customized, as desired for a given target application or end-use. In at least some embodiments, guide feature 137' may be generally L-shaped, with one leg being aligned substantially parallel with spacer 136' and the other leg being aligned substantially perpendicular with spacer 136'. Guide feature 137' may extend from spacer 136' in a given desired direction and, optionally, elevation. In accordance with some embodiments, guide feature 137' may be at least partially offset from spacer 136', extending laterally adjacent the portion of spacer 136' intended to be inserted between substrates 20, 30. Guide feature 137' may be substantially planar but reside in a plane above that of underlying spacer 136'. In this configuration, guide feature 137' may serve as a reference stopping point (e.g., a ceiling) for spacer 138' (discussed below) as it advances in the z-direction within bonder chamber 410. In this manner, once spacer 138' directly (or indirectly) contacts the underside of guide feature 137', spacer 138' may stop advancing in the z-direction and may begin advancing toward substrates 20, 30 for insertion therebetween, as discussed below. Other suitable configurations for guide feature 137' will depend on a given application and will be apparent in light of this disclosure.

The bonding process using transport device 100 differs substantially from the bonding process using conventional transport fixtures. Conventional transport fixtures transport aligned wafers into a bonding device and must remain in the bonding device throughout the duration of the bonding process. In contrast, transport device 100 may allow for the transportation of aligned substrates (e.g., wafers) into a bonding device and then may be removed from the bonding chamber prior to the bonding process. Accordingly, transport device 100 may be subjected to only brief durations of idle temperatures in the bonding devices (e.g., approximately 300° C., as compared to the 500° C. temperatures) and hour-long durations that conventional transport fixtures are subjected to. As a result, transport device 100 may experience less mechanical and thermal stress and requires less maintenance, which may act to increase efficiency and reduce costs.

Figure 7:
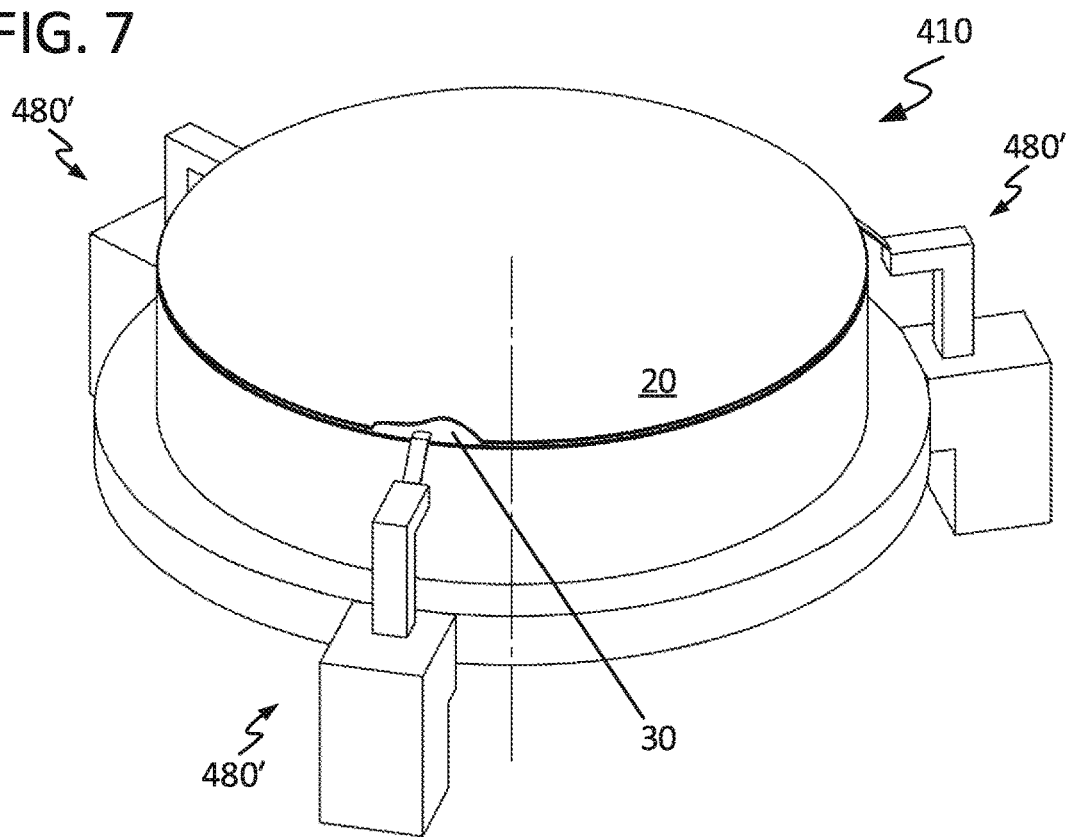
FIG. 7 illustrates an isometric partial side view of a bonder chamber including a plurality of bonder chamber spacer assemblies configured in accordance with an embodiment of the present disclosure.

FIG. 7 illustrates an isometric partial side view of a bonder chamber 410 including a plurality of bonder chamber spacer assemblies 480' configured in accordance with an embodiment of the present disclosure. As can be seen, bonder chamber 410 may include a first spacer assembly 480' at a first location, a second spacer assembly 480' at a second location, and a third spacer assembly 480' at a third location. Of course, as will be appreciated in light of this disclosure, a lesser quantity (e.g., two or fewer) or greater quantity (e.g., four or more) of spacer assemblies 480' may be provided, in accordance with other embodiments, as desired for a given target application or end-use.

Figure 8:
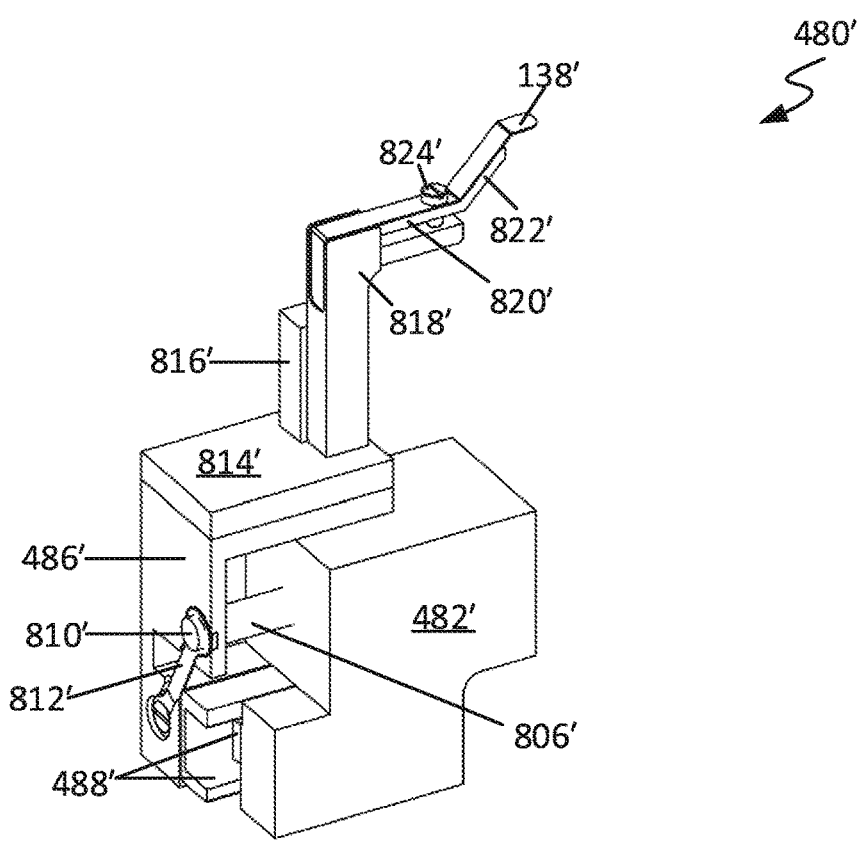
FIG. 8 illustrates an isometric side view of a bonder chamber spacer assembly configured in accordance with an embodiment of the present disclosure.
Figure 9:
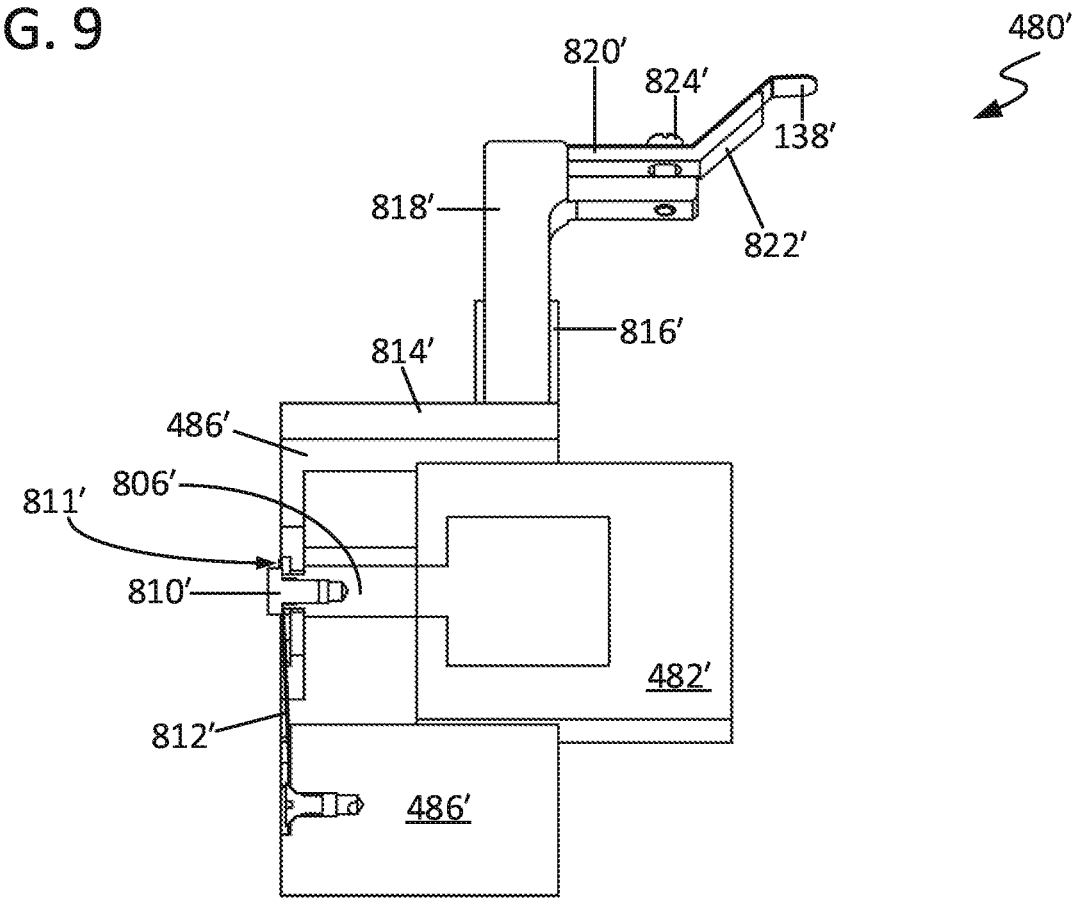
FIGS. 9-10 illustrate a cross-sectional side elevation view and an isometric cross-sectional partial side view, respectively, of a bonder chamber spacer assembly configured in accordance with an embodiment of the present disclosure.
Figure 10:
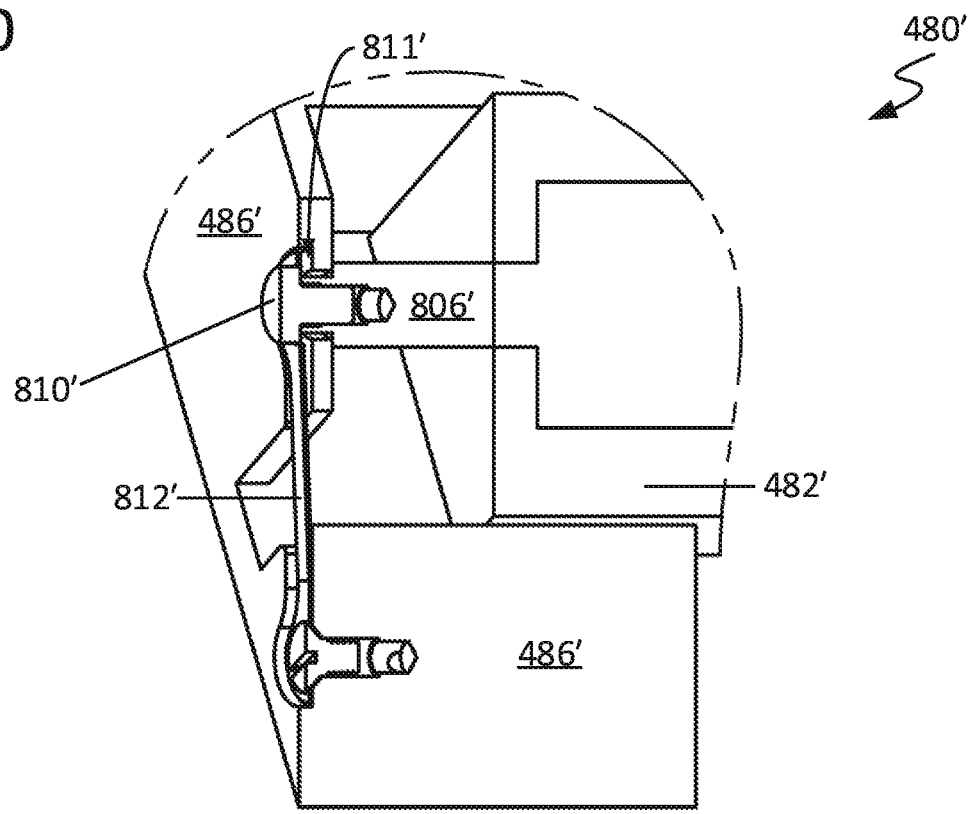
Figure 11:
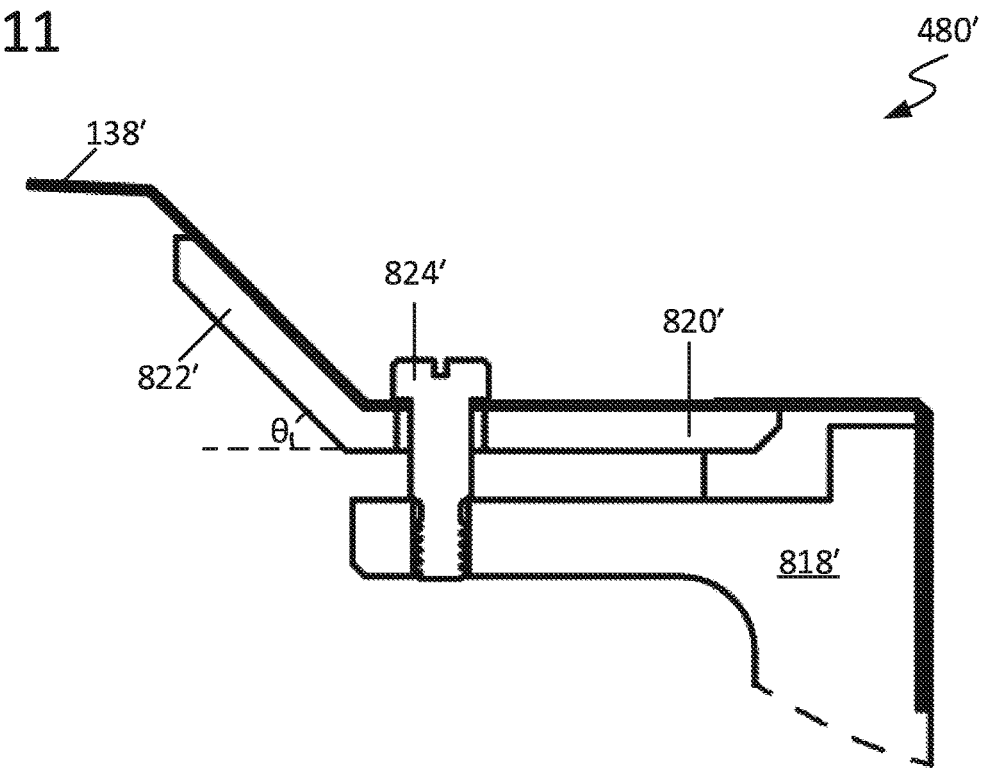
FIG. 11 illustrates a cross-sectional partial side view of a bonder chamber spacer assembly configured in accordance with an embodiment of the present disclosure.

FIG. 8 illustrates an isometric side view of a spacer assembly 480' configured in accordance with an embodiment of the present disclosure. FIGS. 9-10 illustrate a cross-sectional side elevation view and an isometric cross-sectional partial side view, respectively, of a spacer assembly 480' configured in accordance with an embodiment of the present disclosure. FIG. 11 illustrates a cross-sectional partial side view of a spacer assembly 480' configured in accordance with an embodiment of the present disclosure.

As can be seen from FIGS. 8-11, spacer assembly 480' may include a mounting portion 486', which may be coupled, directly or indirectly, with another portion of bonder chamber 410. To that end, mounting portion 486' may be coupled via any suitable fastening means, as will be apparent in light of this disclosure. The dimensions and specific configuration of mounting portion 486' may be customized, as desired for a given target application or end-use. As will be appreciated in light of this disclosure, mounting portion 486' may be configured to operate in much the same manner and to serve much the same purpose, for example, as shelf 486 discussed in the '689 application, in accordance with some embodiments. Other suitable configurations for mounting portion 802' will depend on a given application and will be apparent in light of this disclosure.

Spacer assembly 480' may include a driver 482' which may be coupled, directly or indirectly, with mounting portion 486'. Driver 482' may be configured to provide for linear movement (e.g., extension and retraction) of an element coupled thereto. As will be appreciated in light of this disclosure, driver 482' may be configured to operate in much the same manner and to serve much the same purpose, for example, as pneumatic piston 482 discussed in the '689 application, in accordance with some embodiments. In at least some embodiments, driver 482' may be a piston-type pneumatic drive configured as typically done. The present disclosure is not intended to be so limited, however, as in some other embodiments, driver 482' may be a mechanical, electronic, or other suitable drive element, as will be apparent in light of this disclosure. The stroke length of driver 482' may be customized, as desired for a given target application or end-use. In at least some embodiments, driver 482' may have a hard-stop stroke length. Other suitable configurations for driver 482' will depend on a given application and will be apparent in light of this disclosure.

Spacer assembly 480' further may include a shaft 806', which may be coupled, directly or indirectly, with driver 482'. The dimensions and specific configuration of shaft 806' may be customized, as desired for a given target application or end-use. In at least some embodiments, shaft 806' may be generally cylindrical in shape. In accordance with some embodiments, a first end (e.g., a proximal end) of shaft 806' may be operatively coupled with driver 482'. In accordance with some embodiments, a second end (e.g., a distal end) of shaft 806' may be operatively coupled with mounting portion 486' and may interface with a biasing element 812' (discussed below). At that interface, mounting portion 486' may receive the second end of shaft 806' with a given degree of clearance (e.g., a gap), providing a floating coupling 811'. In this manner, driver 482' may drive shaft 806' in a linear fashion, and shaft 806' may apply force to mounting portion 486' and biasing element 812'. Other suitable configurations for shaft 806' will depend on a given application and will be apparent in light of this disclosure.

As previously noted, spacer assembly 480' may include a biasing element 812'. Biasing element 812' may be configured as a generally elongate body having a first end configured to interface with the second end (e.g., distal end) of shaft 806'. To that end, a fastener 810' may be employed, the fastener 810' defining the capture range of shaft 806' at its interface with mounting portion 486'. A second end of biasing element 812' may be coupled, directly or indirectly, with bearing 488' (discussed below) via one or more suitable fasteners. In accordance with some embodiments, biasing element 812' may be configured to provide for radial pre-loading, providing a pre-loaded staring point at floating coupling 811' for outward radial thermal expansion compliance for substrates 20, 30. In this manner, biasing element 812', and thus spacer assembly 480' more generally, may allow for spacer 138' (discussed below) to move as substrates 20, 30 radially grow or shrink in size because of temperature changes in bonder chamber 410. To such ends, biasing element 812' may be, for example, a low-force leaf spring or other suitable spring element configured to provide a given degree of pre-loading. In some cases, biasing element 812' may be configured to provide a restoring force in the range of about 0.5-2.0 N, though greater or lesser forces may be provided, as desired for a given target application or end-use. As will be appreciated in light of this disclosure, the restoring force provided by biasing element 812' may be opposed, in a substantially equal or otherwise desired manner, by the restoring force provided by a given biasing element 712' of a given spacer assembly 130', as previously discussed. Other suitable configurations for biasing element 812' will depend on a given application and will be apparent in light of this disclosure.

Furthermore, as previously noted, spacer assembly 480' may include a bearing 488', which may be coupled, directly or indirectly, with mounting portion 486'. In accordance with some embodiments, bearing 488' may be configured to facilitate linear movement (e.g., extension and retraction) of an element coupled therewith. To that end, bearing 488' may be, for example, a linear-motion bearing including sliding rail components configured as typically done. By virtue of the coupling of driver 482' with shaft 806', bearing 488' may be able to advance or retreat as driver 482' advances or retreats shaft 806'. Thus, bearing 488' may have a stroke length substantially the same as the stroke length of driver 482', as discussed above. Also, by virtue of the coupling of biasing element 812' with bearing 488', bearing 488' may experience the restoring force, in part or in whole, provided by biasing element 812'. Other suitable configurations for bearing 488' will depend on a given application and will be apparent in light of this disclosure.

As can be seen further from FIGS. 8-11, spacer assembly 480' may include a base portion 814', which may be coupled, directly or indirectly, with mounting portion 486'. Base portion 814' may have a pedestal portion 816' extending therefrom. The shape and dimensions of base portion 814' and its attendant pedestal portion 816' may be customized, as desired for a given target application or end-use. In at least some embodiments, pedestal portion 816' may extend away from base portion 814' in a substantially perpendicular manner. Numerous suitable configurations for base portion 814' and pedestal portion 816' will be apparent in light of this disclosure.

Spacer assembly 480' also may include an arm portion 818', which may be coupled, directly or indirectly, with pedestal portion 816'. In accordance with some embodiments, arm portion 818' may be configured to hold or otherwise provide for mounting of bar portion 820' (discussed below) thereon. To that end, the shape and dimensions of arm portion 818' may be customized, as desired for a given target application or end-us. In at least some embodiments, arm portion 818' may be generally L-shaped, with one leg being aligned substantially parallel with pedestal portion 816' and the other leg being aligned substantially perpendicular with pedestal portion 816'. Other suitable configurations for arm portion 818' will depend on a given application and will be apparent in light of this disclosure.

As previously noted, spacer assembly 480' may include a bar portion 820', which may be coupled, directly or indirectly, with arm portion 818'. In accordance with some embodiments, bar portion 820' may be configured to hold or otherwise provide for mounting of spacer 138' (discussed below) thereon. To that end, the shape and dimensions of bar portion 820' may be customized, as desired for a given target application or end-us. In at least some embodiments, bar portion 820' may be a generally elongate body having an angled portion 822' at one of its ends (e.g., its distal end). As can be seen with specific reference to FIG. 11, angled portion 822' may extend away from arm portion 818' at a given angle (θ), which may be customized, as desired for a given target application or end-use. Other suitable configurations for bar portion 820' will depend on a given application and will be apparent in light of this disclosure.

As can be seen further from FIGS. 8-11, spacer assembly 480' may include a spacer 138', which may be coupled, directly or indirectly, with bar portion 820'. Spacer 138' may be a spacer flag or other suitable spacer body configured to be inserted, in a temporary or otherwise desired manner, between substrates 20, 30. As will be appreciated in light of this disclosure, spacer 138' may be configured to operate in much the same manner and to serve much the same purpose, for example, as spacers 138a, 138b, 138c discussed in the '689 application, in accordance with some embodiments. To such ends, the shape and dimensions of spacer 138' may be customized, as desired for a given target application or end-use. In accordance with some embodiments, spacer 138' may be smaller in at least one dimension (e.g., thinner in vertical profile, as seen from a side elevation viewpoint) than spacer 136', and in at least some instances this difference in dimension(s) may facilitate the spacer handoff process (described herein). By virtue of the coupling of driver 482' with shaft 806', mounting portion 486', and bearing 488', spacer 138' may be able to advance or retreat as driver 482' advances or retreats shaft 806'. Thus, spacer 138' may have a stroke length substantially the same as the stroke length of driver 482', as discussed above. Also, by virtue of the coupling of biasing element 812' with bearing 488', spacer 138' may experience the restoring force, in part or in whole, provided by biasing element 812'. As previously discussed, this may provide for a given degree of radial compliance, as desired for a given target application or end-use. Moreover, spacer assembly 480' may include a limiting stop element 824' (e.g., such as a shoulder screw or other suitable body, which optionally may be a fastener) configured to provide spacer 138' with a given degree of pre-loading in the region of angled portion 822' of bar portion 820'. In some instances, spacer 138' may be provided with a light pre-load force against limiting stop element 824', that pre-load force being of sufficiently low magnitude to prevent (or otherwise reduce) opportunity for deflection or other movement of spacer 136' during the spacer handoff process (described herein). In some cases, this pre-load force may be in the range of about 0.5-2.0 N, though greater or lesser forces may be provided, as desired for a given target application or end-use.

Spacer(s) 138' may be used by the bonding device to space the two stacked substrates 20, 30 when they are placed within the bonding device. As can be seen, spacer(s) 138' may be positioned in proximate locations to spacer(s) 136', which may be spaced substantially equidistantly about the semi-circular perimeter of floating carrier 120. As an overview, bonding in accordance with some embodiments, may be achieved, at least in part, due to the use of spacer(s) 138' which are inserted between substrates 20, 30 thereby allowing spacers 136' to be removed, and the entire transport device 100 to be removed from the bonding chamber. The aligned and spaced substrates 20, 30 then may be pinned with pin 455' (discussed below), and then a bonding force may be applied on the pinned substrates 20, 30. Once bonding is complete, transport device 100 may be used to remove the bonded substrates 20, 30 from the bonding device. Other suitable configurations for spacer 138' will depend on a given application and will be apparent in light of this disclosure.

Figure 12:
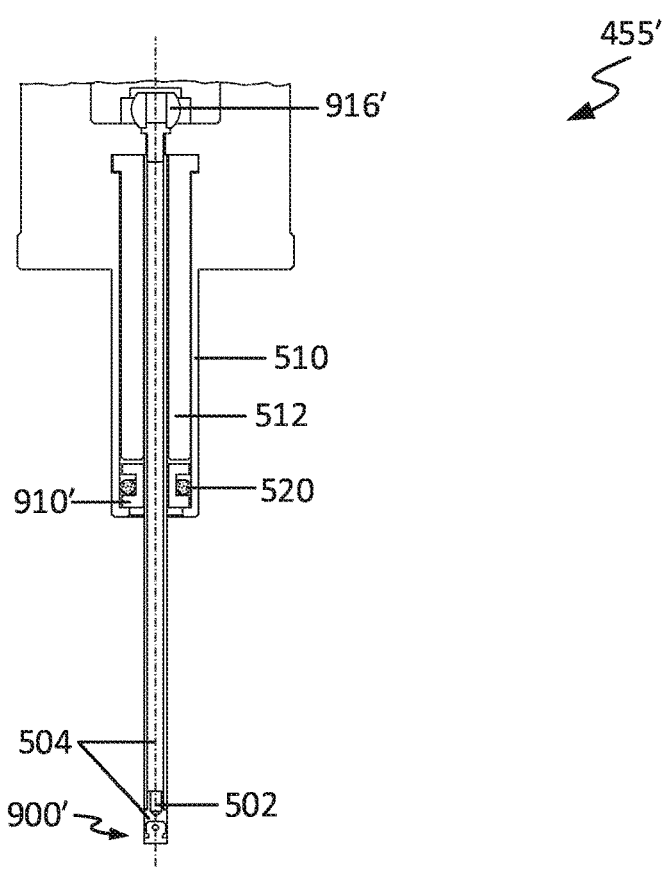
FIG. 12 illustrates a cross-sectional partial side elevation view of a pin configured in accordance with an embodiment of the present disclosure.
Figure 13:
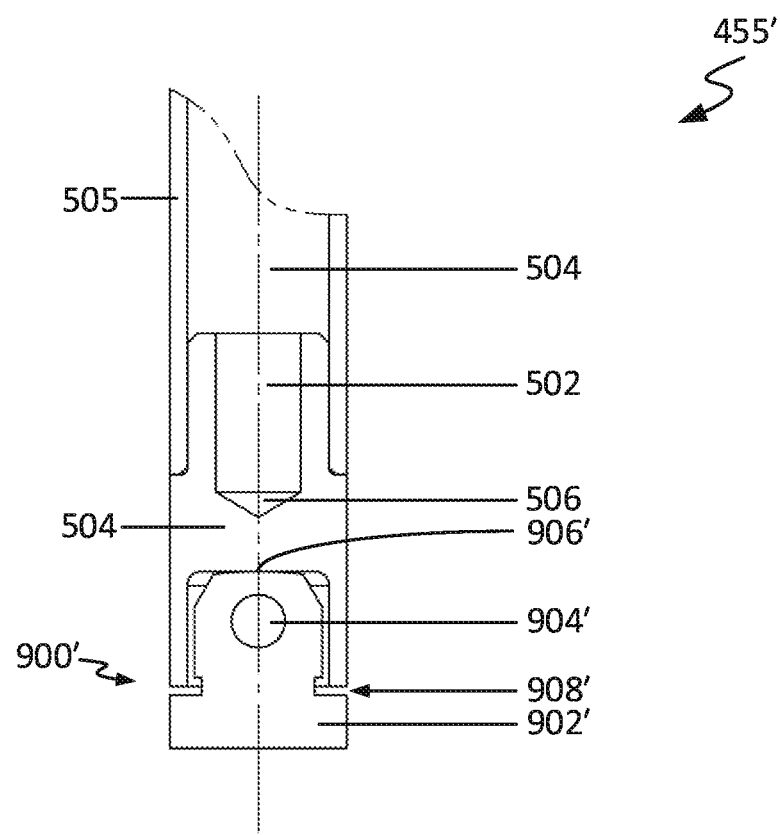
FIG. 13 illustrate cross-sectional partial side elevation views of a pin configured in accordance with an embodiment of the present disclosure.
Figure 14:
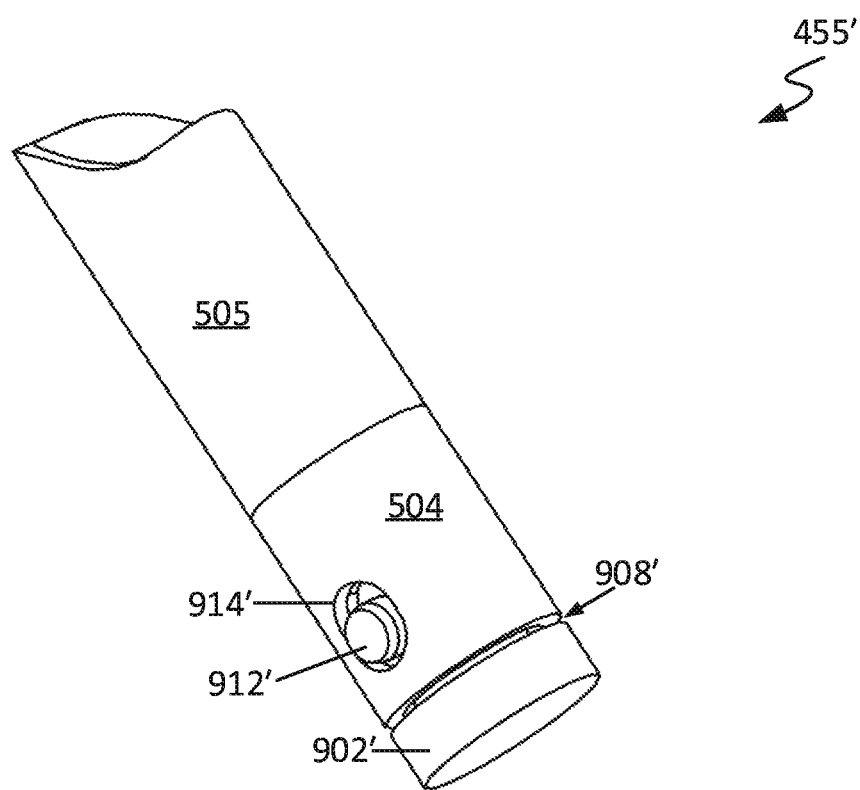
FIG. 14 illustrates an isometric partial side view of a pin configured in accordance with an embodiment of the present disclosure.

FIG. 12 illustrates a cross-sectional partial side elevation view of a pin 455' configured in accordance with an embodiment of the present disclosure. FIG. 13 illustrates a cross-sectional partial side elevation view of a pin 455' configured in accordance with an embodiment of the present disclosure. FIG. 14 illustrates an isometric partial side view of a pin 455' configured in accordance with an embodiment of the present disclosure. As will be appreciated in light of this disclosure, in a general sense, pin 455' may be configured to operate in much the same manner and to serve much the same purpose, for example, as any of pins 455a, 455b, and 455c discussed in the '689 application, in accordance with some embodiments. Pin 455' may be constructed from titanium, ceramics such as silicon nitride ($Si_3N_4$) ceramics, or other materials, and may include a center pin 502 which is surrounded by a lower tube or sleeve 504 positioned along a bottom portion of pin 455'. Lower tube 504 may be of any desired cross-sectional geometry (e.g., circular tubular or annular; rectangular tubular). More generally, pin 455' may be of any desired cross-sectional geometry (e.g., circular, elliptical, or other curvilinear shape; rectangular, square, or other polygonal shape). Center pin 502 may include a pin tip 506 that is flat or pointed. As will be further appreciated, pin 455' may be radially compliant near its tip, in accordance with some embodiments, such that it is pre-loaded to center at +0.5 mm with top center locating to allow pin tip 506 to engage paired substrates 20, 30 at a desired angle of incidence. Pre-loading of pin 455' may allow it to have a natural, centered position when actuated, as well as be radially compliant once under force. As a result, pin 455' may be configured to maintain an application of normal force on substrates 20, 30, in accordance with some embodiments.

Pin 455' may be positioned substantially centered within a center housing 510 having a center pin bushing 512, which itself has a bushing fit with a short length-to-diameter ratio, which is used for locating pin 455'. Center pin bushing 512 may provide electrical isolation of pin 455' from the surrounding mechanics of bonder 400, which may be important for anodic bonding processes where significantly high voltages may be used to bond substrates 20, 30. Towards a lower end of center pin bushing 512 is a low-force pre-load to center radial compliant O-ring 520, which may be manufactured from a fluoropolymer or similar materials. O-ring 520 may allow center pin 502 and surrounding tube 504 to move radially within bonder 400.

As can be seen from FIGS. 12-14, pin 455' may include a foot portion 900' at its end. In accordance with some embodiments, foot portion 900' may include a body portion 902' configured to contact, directly or indirectly, a substrate 20, 30 to apply a given amount of force thereto. To that end, the dimensions and specific configuration of body portion 902' may be customized, as desired for a given target application or end-use. In at least some embodiments, body portion 902' may be a substantially cylindrical body having a substantially planar, solid base. In the uncompressed state of foot portion 900', a gap 908' may exist between body portion 902' and tube 504. However, as pin 455' is made incident with substrates 20, 30, gap 908' may close, in part or in whole.

Body portion 902' may have an aperture 904' defined therein, through which a retention pin 912' or other fastening element may be inserted to retain body portion 902' in position with respect to tube 504 while allowing for movement along one or more axes. To that end, the dimensions and shape of aperture 904' may be customized, as desired for a given target application or end-use. In at least some embodiments, aperture 904' may be substantially circular in shape. In some instances, a corresponding oblong aperture 914' may be provided in tube 504 and made to align, in part or in whole, with aperture 904'. The retention pin 912' or other fastening element may move vertically within the oblong aperture 914' when foot portion 900' transitions between its uncompressed and compressed states at the end of tube 504.

Body portion 902' further may include a point contact feature 906' disposed opposite its base. In accordance with some embodiments, point contact feature 906' may be configured to be contacted, directly or indirectly, by pin tip 506 in a manner which serves to transmit the applied downward force of center pin 502 to body portion 902' (and thus substrates 20, 30 with which body portion 902' may be incident). In this manner, foot portion 900' may be configured to provide uniform distribution of force to substrates 20, 30 while eliminating (or otherwise minimizing) the opportunity for shifting of those substrates 20, 30 within bonder chamber 410. To such ends, the dimensions and geometry of point contact feature 906' may be customized, as desired for a given target application or end-use. In at least some embodiments, point contact feature 906' may be substantially hemispherical or otherwise convex, extending from the local surface of body portion 902'. Other suitable configurations for foot portion 900' will depend on a given application and will be apparent in light of this disclosure.

As can be seen further from FIGS. 12-14, pin 455' also may include a guide feature 910', which may be disposed within center pin bushing 512. In accordance with some embodiments, guide feature 910' may be configured to guide tube 504, and thus center pin 502, providing a surface on which tube 504 may slide in operation of pin 455'. To such ends, the dimensions and specific configuration of guide feature 910' may be customized, as desired for a given target application or end-use. In at least some instances, guide feature 910' may be sized such that there is a gap between its exterior surface and the interior sidewall surface of center pin bushing 512, thereby allowing for a given degree of lateral movement of guide feature 910', and thus tube 504, within center pin bushing 512. In some embodiments, guide feature 910' may interface with an O-ring 520 in a manner which allows center pin 502 and surrounding tube 504 to move radially while also providing a pre-load to center force. As will be appreciated in light of this disclosure, O-ring 520 may be configured to operate in much the same manner and to serve much the same purpose, for example, as in the '689 application, in accordance with some embodiments. In at least some cases, guide feature 910' may be formed, in part or in whole, from a high-performance plastic material conducive to the sliding movement desired for tube 504. Other suitable configurations for guide feature 910' will depend on a given application and will be apparent in light of this disclosure.

Pin 455' further may include a bearing 916', which may be disposed at an end of tube 504. In accordance with some embodiments, bearing 916' may be configured to permit tube 504, and thus guide feature 910' through which tube 504 passes, to move radially within center bushing 510. In this manner, bearing 916' may provide a gimbaling or other pivoting behavior for center pin 502 and foot portion 900', providing a given degree of radial compliance and control over angle of incidence with substrates 20, 30, as desired for a given target application or end-use. To such end, bearing 916' may be, in at least some embodiments, a spherical or other round bearing configured as typically done. Other suitable configurations for bearing 916' will depend on a given application and will be apparent in light of this disclosure.

In accordance with some embodiments, foot portion 900' may be capable of gimbal-type movement, while also being configured to receive a point load from center pin 502. In this manner, foot portion 900' may provide for controlling the force, and thus pressure, to be applied uniformly to substrates 20, 30. In at least some instances, a true normal force, and thus true even pressure, may be achieved. As such, foot portion 900' may be utilized, in accordance with some embodiments, to apply pressure to substrates 20, 30 in a manner which substantially matches pressure applied by surrounding chucks 320, 330 (discussed above).

Figure 15:
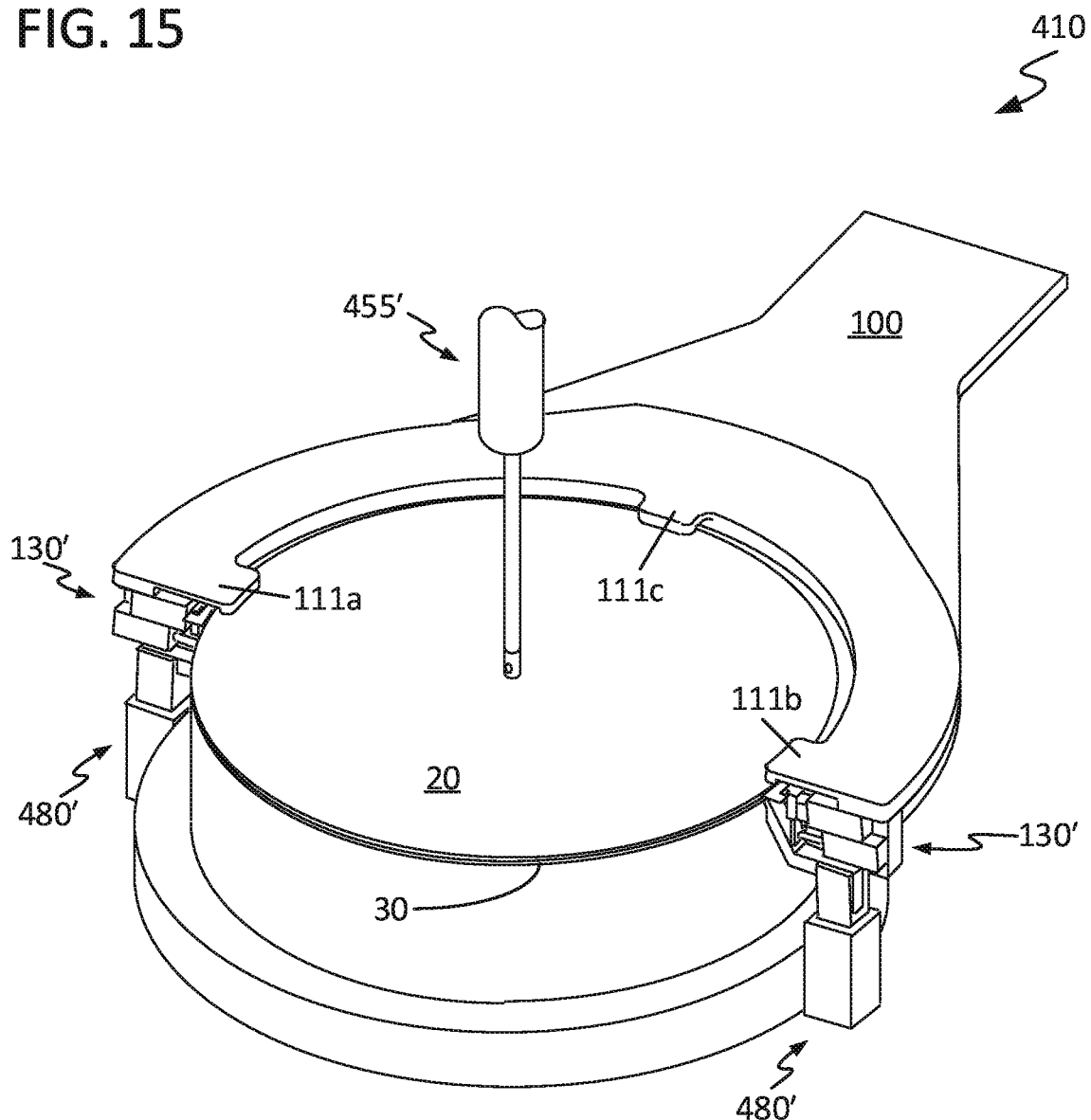
FIG. 15 illustrates an isometric view of an aligned substrate transport device and pin disposed in a bonder chamber, in accordance with an embodiment of the present disclosure.

FIG. 15 illustrates an isometric view of an aligned substrate transport device 100 and pin 455' disposed in a bonder chamber 410, in accordance with an embodiment of the present disclosure. As described herein, transport device 100 may carry a plurality of substrates 20, 30 within bonder chamber 410. One or more spacer assemblies 130' hosted by transport device 100 initially may have their respective spacers 136' disposed between substrates 20, 30. One or more spacer assemblies 480' hosted by bonder chamber 410 then may be caused to insert their respective spacers 138' between substrates 20, 30. Simultaneously (or previously or subsequently), pin 455' may be caused to engage substrates 20, 30 to apply pressure thereto to hold substrates 20, 30 steady. With spacer(s) 138' in position and pin 455' steadying substrates 20, 30, spacer(s) 136' may be retracted from being disposed between substrates 20, 30, effectuating a spacer hand-off in bonder chamber 410. Additional details on this process are provided immediately below.

Figure 16A:
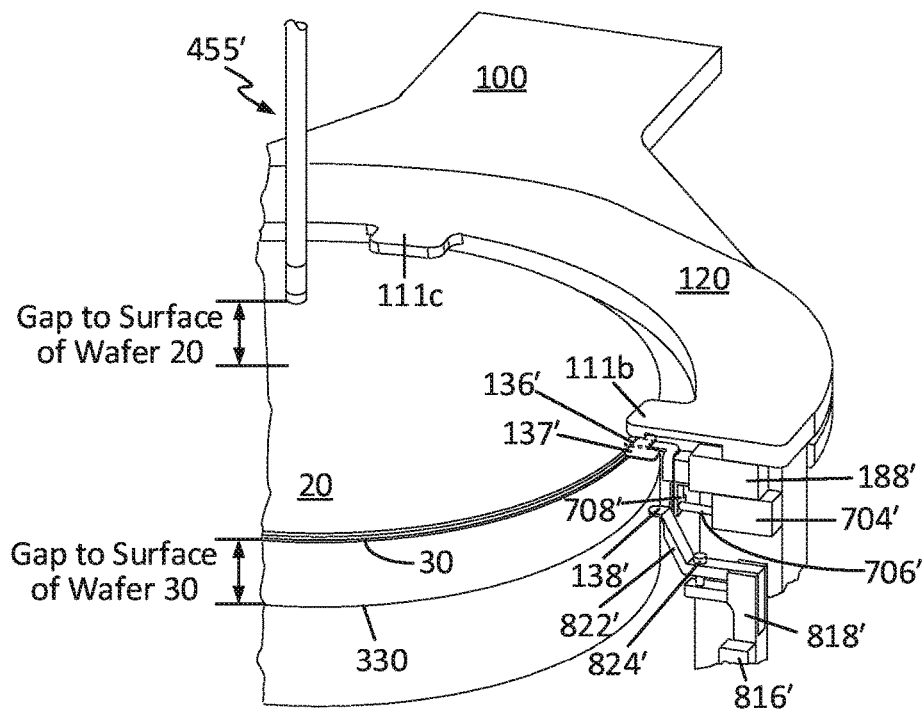
FIGS. 16A-16B illustrate partial isometric views of several stages in a spacer exchange process, in accordance with an embodiment of the present disclosure.
Figure 16B:
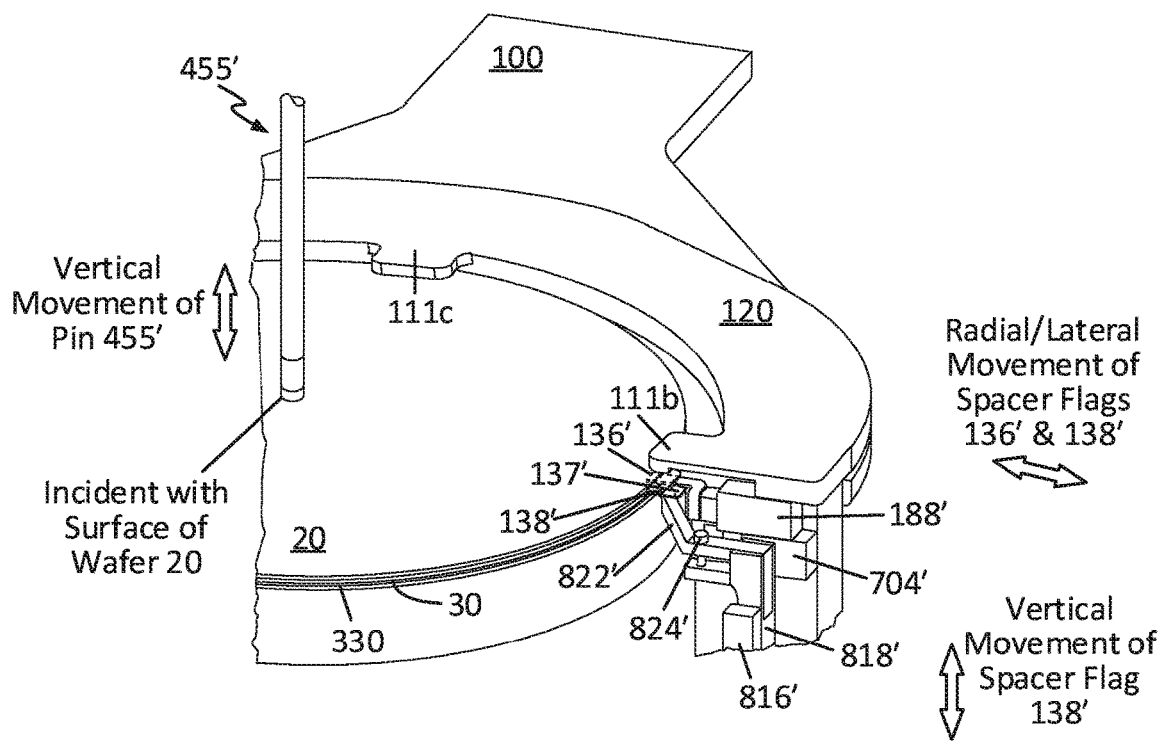

FIGS. 16A-16B illustrate partial isometric views of several stages in a spacer exchange process, in accordance with an embodiment of the present disclosure. As can be seen from FIG. 16A, the spacer handoff process may begin with spacer 136' being disposed between substrates 20, 30. In this position, guide feature 137' may remain jutting out to the side of spacer 136', in a plane above that of spacer 136'. Spacer 138' then may move upward along the z-axis until it is incident with the underside of guide feature 137'. Thus, in a general sense, guide feature 137' may serve as a ceiling defining the bounds to which spacer 138' may move in the z-direction in bonder chamber 410. Simultaneously (or previously or subsequently), pin 455' may engage substrates 20, 30, as described herein. As can be seen from FIG. 16B, spacer 138' then may advance toward and be inserted between substrates 20, 30, remaining below guide feature 137'. Spacer 136' and guide feature 137' then may retreat from substrates 20, 30, with spacer 138' remaining disposed between substrates 20, 30.

In this spacer handoff process, pin 455' may work in concert with spacer assemblies 130' and 480' to retain substrates 20, 30 in position while providing for radial compliance during the spacer handoff process. When foot portion 900' of pin 455' first contacts substrates 20, 30, body portion 902' may planarize, becoming substantially co-planar or otherwise substantially parallel with the incident surface of substrates 20, 30. As center pin 502 applies force to foot portion 900' at point contact feature 906' thereof, foot portion 900' then applies that force over the area of the substantially planar, solid base of body portion 902', thus applying pressure evenly to substrates 20, 30 in the localized region of incidence. By virtue of its configuration, foot portion 900' may distribute that pressure in a flat, even manner, thereby providing good clamping of underlying substrates 20, 30 without warping them and while staking substrates 20, 30 in a manner which prevents or otherwise reduces the opportunity for asymmetrical thermal expansion, as otherwise might occur because of processing temperatures in bonder chamber 410. Thus, foot portion 900', and pin 455' more generally, may provide for a given degree of control over radial growth of substrates 20, 30, especially about the center points thereof.

It should be emphasized that the above-described embodiments of the present disclosure, particularly, any "preferred" embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A substrate processing system configured to bond a pair of substrates, the substrate processing system comprising:
a processing chamber; and
a spacer assembly disposed within the processing chamber and comprising a spacer configured to be:
inserted between the pair of substrates; and
in contact with a guide feature of an aligned substrate transport device configured to transport the pair of substrates within the substrate processing system and disposed within the processing chamber, wherein the spacer is configured to stop advancing within the processing chamber upon contact with the guide feature before being inserted between the pair of substrates.

2. The substrate processing system of claim 1, wherein the spacer assembly further comprises a biasing element configured to provide for radial pre-loading, in that it provides a pre-loaded starting point for outward radial thermal expansion compliance for the pair of substrates.

3. The substrate processing system of claim 2, wherein:
the spacer assembly further comprises:
a driver;
a shaft operatively coupled with the driver; and
a bearing operatively coupled with the shaft and the spacer; and
the driver is configured to provide linear movement of the shaft in a manner providing linear movement of the bearing and the spacer.

4. The substrate processing system of claim 3, further comprising a mounting portion operatively coupling the shaft and the bearing such that movement of the mounting portion via the shaft provides movement of the bearing, wherein:
the bearing is mounted to the mounting portion;
the mounting portion and the shaft have a degree of clearance providing a floating coupling therebetween; and
the pre-loaded starting point is provided at the floating coupling.

5. The substrate processing system of claim 4, wherein the biasing element comprises a spring element having:
a first end coupled with the mounting portion; and
a second end interfaced with a portion of the shaft extending beyond the mounting portion.

6. The substrate processing system of claim 1, wherein the spacer assembly is configured to provide the spacer with a pre-load force to reduce opportunity for deflection of the spacer when the spacer is being inserted between the pair of substrates.

7. An apparatus configured to handle a pair of substrates, the apparatus comprising:

a frame member; and
a spacer assembly coupled with the frame member and comprising:
  a first spacer configured to be inserted between the pair of substrates; and
  a guide feature configured to provide a reference stopping point for advancement of a second spacer of a substrate processing system;
wherein the apparatus is configured to transport the pair of substrates within the substrate processing system.

8. The apparatus of claim 7, wherein the guide feature is substantially L-shaped, having:
a first leg affixed to the first spacer and aligned substantially perpendicular with a length of the first spacer; and
a second leg aligned substantially parallel with the length of the first spacer.

9. The apparatus of claim 7, wherein:
the guide feature and the first spacer are of monolithic construction; and
the guide feature is substantially L-shaped, having:
  a first leg extending from the first spacer and aligned substantially perpendicular with a length of the first spacer; and
  a second leg aligned substantially parallel with the length of the first spacer.

10. The apparatus of claim 7, wherein being configured to provide the reference stopping point for the second spacer, the guide feature is configured to physically contact the second spacer and stop advancement of the second spacer in a vertical direction.

11. The apparatus of claim 7, further comprising a biasing element configured to provide for radial pre-loading, in that it provides a pre-loaded starting point for outward radial thermal expansion compliance for the pair of substrates.

12. The apparatus of claim 11, wherein:
the spacer assembly further comprises:
  a driver;
  a shaft operatively coupled with the driver; and
  a bearing operatively coupled with the shaft and the first spacer; and
the driver is configured to provide linear movement of the shaft in a manner providing linear movement of the bearing and the first spacer.

13. The apparatus of claim 12, further comprising an arm portion operatively coupling the shaft and the bearing such that movement of the arm portion via the shaft provides movement of the bearing, wherein:
the arm portion and the shaft have a degree of clearance providing a floating coupling therebetween; and
the pre-loaded starting point is provided at the floating coupling.

14. The apparatus of claim 13, wherein the biasing element comprises a spring element having:
a first end coupled with the bearing; and
a second end interfaced with a portion of the shaft extending beyond the arm portion.

15. A substrate processing assembly comprising:
a substrate processing system configured to bond a pair of substrates, and
an apparatus configured to manipulate a handle the pair of substrates,
wherein the substrate processing system comprises a processing chamber and a first spacer assembly disposed within the processing chamber and comprising a first spacer,
wherein the apparatus configured to manipulate a handle the pair of substrates comprises a frame member and a second spacer assembly coupled with the frame member and comprising a second spacer and a guide feature,
wherein the second spacer of the apparatus is configured to be inserted between the pair of substrates and the guide feature is configured to provide a reference stopping point for advancement of the first spacer of the substrate processing system,
wherein the first spacer of the substrate processing system is configured to be inserted between the pair of substrates and to be in contact with the guide feature disposed within the processing chamber, wherein the first spacer is configured to stop advancing within the processing chamber upon contact with the guide feature before being inserted between the pair of substrates, and
wherein the apparatus is configured to transport the pair of substrates within the substrate processing system.

* * * * *